(12) United States Patent
Jang

(10) Patent No.: US 8,040,313 B2
(45) Date of Patent: Oct. 18, 2011

(54) SHIFT REGISTER AND DISPLAY DEVICE USING THE SAME AND DRIVING METHOD THEREOF

(75) Inventor: Yong Ho Jang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 1056 days.

(21) Appl. No.: 11/373,981

(22) Filed: Mar. 14, 2006

(65) Prior Publication Data

US 2006/0267911 A1 Nov. 30, 2006

(30) Foreign Application Priority Data

May 26, 2005 (KR) .................. 10-2005-0044377

(51) Int. Cl.
*G09G 3/36* (2006.01)
*G11C 19/00* (2006.01)
(52) U.S. Cl. .......................... 345/100; 377/64
(58) Field of Classification Search .................. 345/100; 377/64
See application file for complete search history.

(56) References Cited

U.S. PATENT DOCUMENTS

| | | | | |
|---|---|---|---|---|
| 5,410,583 A * | 4/1995 | Weisbrod et al. | ................ | 377/75 |
| 5,859,630 A * | 1/1999 | Huq | .............................. | 345/100 |
| 7,173,676 B2 | 2/2007 | Jeon et al. | | |
| 7,529,333 B2 * | 5/2009 | Kim et al. | ........................ | 377/64 |
| 2003/0227433 A1 | 12/2003 | Moon | | |
| 2004/0150610 A1 * | 8/2004 | Zebedee et al. | ............... | 345/100 |

FOREIGN PATENT DOCUMENTS

| | | |
|---|---|---|
| CN | 1116752 A | 2/1996 |
| CN | 1240043 A | 12/1999 |
| CN | 1609939 A | 4/2005 |
| JP | 61035011 A | 2/1986 |
| JP | H02-246097 | 10/1990 |
| JP | H05-297345 | 11/1993 |
| JP | 5-323278 | 12/1993 |
| JP | 8-313931 | 11/1996 |
| JP | 2001-506044 | 5/2001 |
| JP | 2003076346 A | 3/2003 |
| JP | 2004184550 A | 7/2004 |
| JP | 2006189767 A | 7/2006 |
| KR | 10-2000-0069301 | 11/2000 |
| KR | 10-2004-0095053 | 11/2004 |
| WO | 98/26423 | 6/1998 |
| WO | 2004104981 A1 | 12/2004 |

* cited by examiner

Primary Examiner — Richard Hjerpe
Assistant Examiner — Andrew Schnirel
(74) Attorney, Agent, or Firm — Morgan, Lewis & Bockius LLP

(57) ABSTRACT

A shift register includes a plurality of first to n-numbered stages, where n is a positive integer. Each stage includes a node controller controlling respective voltages of a first node and a second node in accordance with an output signal from the (i−j1)-numbered stage and an output signal from the (i+j2)-numbered stage, wherein i is a positive integer from 1 to n, j1 is a positive integer greater than or equal to 2, and j2 is a positive integer equal to or different from j1; and an output unit outputting one of a plurality of clock signals in accordance with the respective voltages of the first and second nodes.

7 Claims, 20 Drawing Sheets

SHIFT REGISTER AND DISPLAY DEVICE USING THE SAME AND DRIVING METHOD THEREOF

This application claims the benefit of the Korean Patent Application No. 2005-44377, filed on May 26, 2005, which is hereby incorporated by reference in its entirety.

BACKGROUND OF THE INVENTION

1. Field of the Invention

The present invention relates to display device, and more particularly, to a shift register for a display device and a driving method thereof.

2. Discussion of the Related Art

Recently, various flat panel displays that are lighter and less bulky than cathode ray tubes (CRT) have been developed. These flat panel displays include, for example, a liquid crystal display (LCD), a field emission display (FED), a plasma display panel (PDP), and a light emitting display (LED). In particular, the LCD includes an LCD panel having liquid crystal cells in a matrix arrangement, and a driving circuit for driving the LCD panel. The LCD displays an image by controlling a light transmittance of the liquid crystal cells using an electric field.

The liquid crystal cells are disposed in pixel regions formed by crossings of gate lines with data lines in the LCD panel. The LCD panel is provided with a common electrode and pixel electrodes for applying an electric field to each of the liquid crystal cells. Each of the pixel electrodes is electrically connected to one of the data lines through source and drain terminals of a switching element, for example, a thin film transistor (TFT).

The TFT used for the LCD includes a semiconductor layer of amorphous silicon or polycrystalline silicon. An amorphous silicon layer provides good uniformity and stable characteristics to the LCD panel. However, it is difficult to improve pixel density in an amorphous type LCD due to its low charge mobility. To overcome such drawbacks, a driving circuit using amorphous silicon has been built into an array substrate.

FIG. 1 illustrates a related art LCD. Referring to FIG. 1, the related art LCD includes an LCD panel 10, a printed circuit board 20, a plurality of tape carrier packages (TCP) 30, and a plurality of data integrated circuits 40. The LCD panel 10 is provided with a gate shift register 50 for supplying gate pulses to an image display unit 12. The printed circuit board 20 is provided with a control circuit (not shown) and a power circuit (not shown). The TCPs 30 are connected between the printed circuit board 20 and the LCD panel 10. The data integrated circuits 40 are respectively provided in the TCPs and supply analog video signals to the image display unit 12.

The image display unit 12 displays images through liquid crystal cells LC arranged in a matrix. Each of the liquid crystal cells LC includes a TFT made of polycrystalline silicon or amorphous silicon as a switching element electrically connected to each crossing of gate lines GL and data lines DL. The data lines DL are supplied with the analog video signals from the data integrated circuits 40. The gate lines GL are supplied with the gate pulses from the gate shift register 50.

Each of the TCPs 30 is electrically connected between the printed circuit board 20 and the LCD panel 10 by a tape automated bonding TAB. Input pads of each TCP 30 are electrically connected to the printed circuit board 20 while output pads of each TCP 30 are electrically connected to the LCD panel 10.

Each of the data integrated circuits 40 is supplied with control signals and data signals from the control circuit through the input pads of each TCP 30 and converts the data signals into analog video signals using the input control signals to supply the analog video signals to the data lines DL of the LCD panel 10 through the output pads of each TCP 30. The gate shift register 50 is directly formed at one side of the LCD panel 10.

FIG. 2 illustrates a gate shift register according to the related art LCD of FIG. 1. The gate shift register 50 includes a plurality of stages 511 to 51n whose output nodes are respectively connected to corresponding gate lines GL1 to GLn. The stages 511 to 51n are respectively connected to a start pulse SP input line and at least one clock signal CLK input line. At least one clock signal CLK is phase-delayed by one clock period. If the number of the clock signals CLK is two, for example, the gate shift register 50 is referred to a two-phase shift register.

FIG. 3 illustrates driving waveforms for the related art gate shift register shown in FIG. 2. Referring to FIG. 3, the gate pulses GP are sequentially supplied to the gate lines GL1, to GLn. Specifically, a first gate pulse GP is applied to the first gate line GL1 in a first time period. A second gate pulse GP is applied to the second gate line GL2 in a second time period following the first time period. So, the gate pulses GP are sequentially applied to the gate lines GL1 to GLn.

Thus, in the related art gate shift register, each of the stages 511 to 51n shifts the start pulse SP by one clock period and output the delayed SP when a clock signal CLK is received. The signal output from each of the stages 511 to 51n of the gate shift register 50 is supplied as a start pulse to the next corresponding stage from 512 to 51n. For example, the output from stage 511 is supplied to state 512, and the output of stage 512 is supplied to stage 513, and so on.

The above-described related art LCD displays a desired images in the image display unit 12 by supplying the analog video signals from the data integrated circuits 40 to the data lines DL and concurrently supplying the gate pulses to the gate lines GL using the gate shift register 50 provided in the LCD panel 10.

In the related art LCD, since all the stages 511 to 51n are connected to the clock signal CLK input line, a load of an output line of the shift register increases, thereby causing errors in operation. Also, in the related art LCD, since the gate pulses are sequentially supplied to the gate lines, it is difficult to perform a divisional scan of the LCD panel 10 and change a scan direction when required.

SUMMARY OF THE INVENTION

Accordingly, the present invention is directed to a shift register, a display device using the same, and a driving method thereof, which substantially obviate one or more problems due to limitations and disadvantages of the related art.

An object of the present invention is to provide a shift register having a reduced load at the output lines of the shift register to avoid errors in operation.

Another object of the present invention is to provide a display device that includes a shift register having a reduced load at the output lines of the shift register to avoid errors in operation.

Another object of the present invention is to provide a method for driving a shift register to reduce a load of output lines of the shift register to avoid any error operation.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a shift register includes a plurality of first to n-numbered stages, where n is a positive integer. Each stage includes a node controller controlling respective voltages of a first node and a second node in accordance with an output signal from the (i−j1)-numbered stage and an output signal from the (i+j2)-numbered stage, wherein i is a positive integer from 1 to n, j1 is a positive integer greater than or equal to 2, and j2 is a positive integer equal to or different from j1; and an output unit outputting one of a plurality of clock signals in accordance with the respective voltages of the first and second nodes.

In another aspect, a display device including a plurality of gate lines crossing a plurality of data lines includes a first and a second shift registers, each of the first and second shift registers including a plurality of first to m-th stages for supplying gate pulses to the gate lines, wherein m is a positive integer, each stage includes a node controller controlling respective voltages of a first node and a second node in accordance with an output signal from the (k−2)-numbered stage and an output signal from the (k+2)-numbered stage, wherein k is a positive integer from 1 to m; and an output unit outputting one of a plurality of clock signals in accordance with the respective voltages of the first and second nodes.

In another aspect, a display device including a plurality of gate lines crossing a plurality of data lines includes a first and a second shift registers, each of the first and second shift registers including a plurality of first to m-th stages for supplying gate pulses to the gate lines, wherein m is a positive integer, each stage includes a node controller controlling respective voltages of a first node and a second node in accordance with an output signal from the (k−2)-numbered stage and an output signal from the (k+1)-numbered stage, wherein k is a positive integer from 1 to m; and an output unit outputting one of a plurality of clock signals in accordance with the respective voltages of the first and second nodes.

In another aspect, a method of driving a shift register including a plurality of first to n-numbered stages, where n is a positive integer includes controlling respective voltages of a first node and a second node in each stage in accordance with an output signal from the (i−j1)-numbered stage and an output signal from the (i+j2)-numbered stage, wherein i is a positive integer from 1 to n, j1 is a positive integer greater than 2, and j2 is a positive integer equal to or different from j1; and outputting one of a plurality of 2j-number of clock signals in accordance with the respective voltages of the first and second nodes.

In another aspect, a method of driving a display device including a plurality of gate lines crossing a plurality of data lines, a first and a second shift registers, each of the first and second shift registers including a plurality of first to m-th stages for supplying gate pulses to the gate lines, wherein m is a positive integer, includes controlling respective voltages of a first node and a second node in each stage in accordance with an output signal from the (k−2)-numbered stage and an output signal from the (k+2)-numbered stage, wherein k is a positive integer from 1 to m; and outputting one of a plurality of clock signals in accordance with the respective voltages of the first and second nodes.

In another aspect, a method of driving a display device including a plurality of gate lines crossing a plurality of data lines, a first and a second shift registers, each of the first and second shift registers including a plurality of first to m-th stages for supplying gate pulses to the gate lines, wherein m is a positive integer, includes controlling respective voltages of a first node and a second node in each stage in accordance with an output signal from the (k−2)-numbered stage and an output signal from the (k+1)-numbered stage, wherein k is a positive integer from 1 to m; and outputting one of a plurality of clock signals in accordance with the respective voltages of the first and second nodes.

In another aspect, a shift register includes a plurality of first to n-numbered stages, where n is a positive integer, each stage outputting one of a plurality of clock signals in response to an output signal from the (i−j1)-numbered stage and an output signal from the (i+j2)-numbered stage, wherein i is a positive integer from 1 to n, j1 is a positive integer greater than or equal to 2, and j2 is a positive integer equal to or different from j1.

In another aspect, a display device including a plurality of gate lines crossing a plurality of data lines includes a first and a second shift registers, each of the first and second shift registers including a plurality of first to m-th stages for supplying gate pulses to the gate lines, wherein m is a positive integer, each stage outputting one of a plurality of clock signals in response to an output signal from the (i−j1)-numbered stage and an output signal from the (i+j2)-numbered stage, wherein i is a positive integer from 1 to m, j1 is a positive integer greater than or equal to 2, and j2 is a positive integer equal to or different from j1.

In another aspect, a display device including a plurality of gate lines crossing a plurality of data lines includes a first and a second shift registers, each of the first and second shift registers including a plurality of first to m-th stages for supplying gate pulses to the gate lines, wherein m is a positive integer, each stage outputting one of a plurality of clock signals in response to an output signal from the (k−2)-numbered stage and an output signal from the (k+1)-numbered stage, wherein k is a positive integer from 1 to m.

In another aspect, a method of driving a shift register including a plurality of first to n-numbered stages, where n is a positive integer includes outputting from each stage one of a plurality of clock signals in response to an output signal from the (i−j1)-numbered stage and an output signal from the (i+j2)-numbered stage, wherein i is a positive integer from 1 to n, j1 is a positive integer greater than or equal to 2, and j2 is a positive integer equal to or different from j1.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
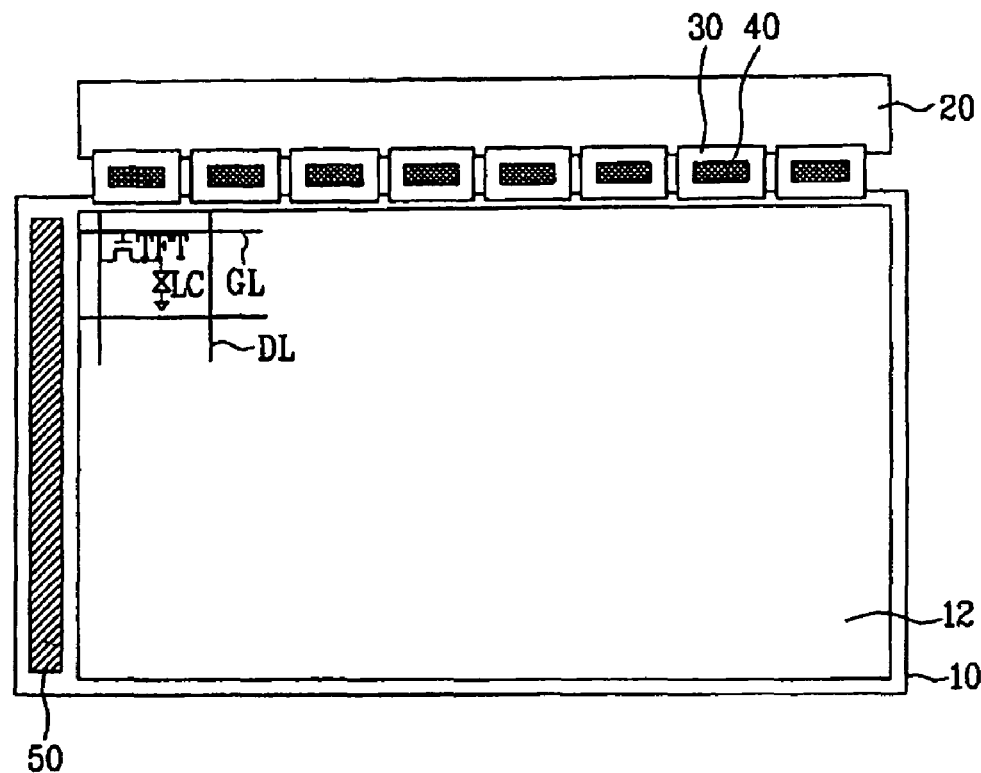
FIG. 1 illustrates a related art LCD.
Figure 2:
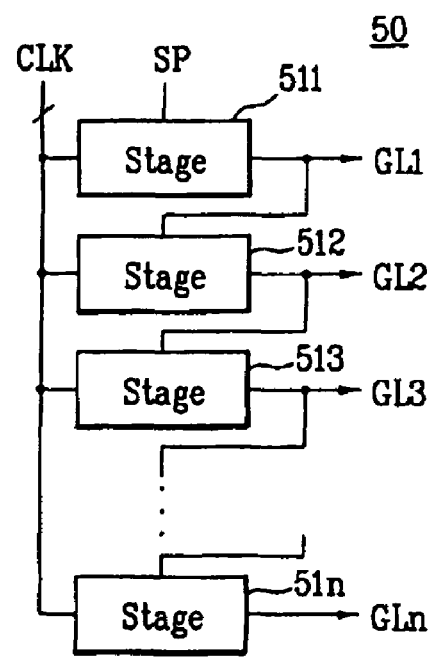
FIG. 2 illustrates a gate shift register according to the related art LCD of FIG. 1.
Figure 3:
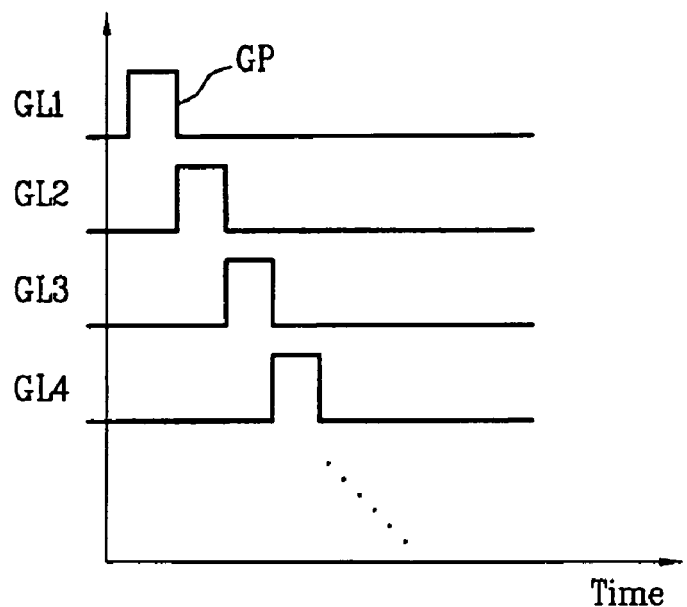
FIG. 3 illustrates driving waveforms for the related art gate shift register shown in FIG. 2.
Figure 4:
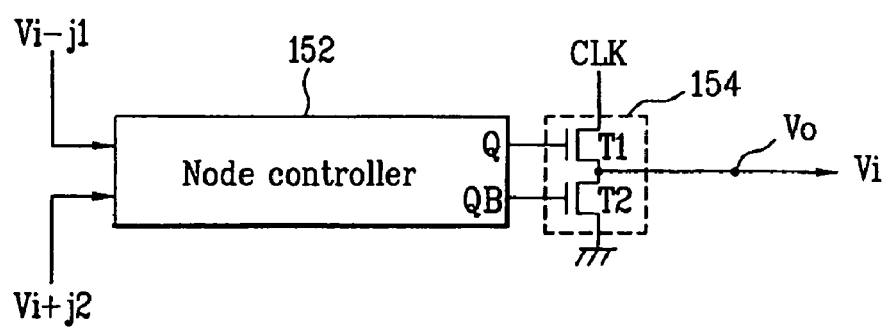
FIG. 4 illustrates an exemplary stage in a shift register according to a first embodiment of the present invention.

FIG. 4 illustrates an exemplary stage in a shift register according to a first embodiment of the present invention. Referring to FIG. 4, a stage 151 in a shift register includes a node controller 152 and an output unit 154. The node controller 152 is provided with an output signal Vi−j1 from an (i−j1)-numbered stage, where i is a positive integer from 1 to n, and j1 is a positive integer greater than 2, and an output signal Vi+j2 from an (i+j2)-numbered stage, where j2 is a positive integer equal to or different from j1. The node controller 152 controls voltages at first and second nodes Q and QB in response to the output signal Vi−j1 from the (i−j1)-numbered stage and the output signal Vi+j2 from the (i+j2)-numbered stage. For example, as shown in Table 1, the node controller 152 controls the voltage on the first node Q in response to the output signal Vi−j1 from the (i−j1)-numbered stage and concurrently controls the voltage on the second node QB in response to the output signal Vi+j2 from the (i+j2)-numbered stage. In an embodiment, j1 and j2 are positive integers equal to each other.

TABLE 1

| Vi − j1 | Vi + j2 | Q | QB |
|---------|---------|---|----|
| 1 | 0 | 1 | 0 |
| 0 | 1 | 0 | 1 |

The output unit 154 outputs an output Vi concurrently with a clock signal CLK that is one of 2j clock signals CLK1 to CLK2j in response to the voltages at the first and second nodes Q and QB. The output unit 154 includes a first switching element T1 supplying the clock signal CLK to the output terminal Vo in response to the voltage on the first node Q, and a second switching element T2 supplying a base power source VSS to the output terminal Vo in response to the voltage on the second node QB. Thus, the shift register (not shown) outputs the corresponding clock signal CLK to the output terminal Vo using the output signal Vi−j1 from the (i−j1)-numbered stage and the output signal Vi+j2 from the (i+j2)-numbered stage.

Figure 5:
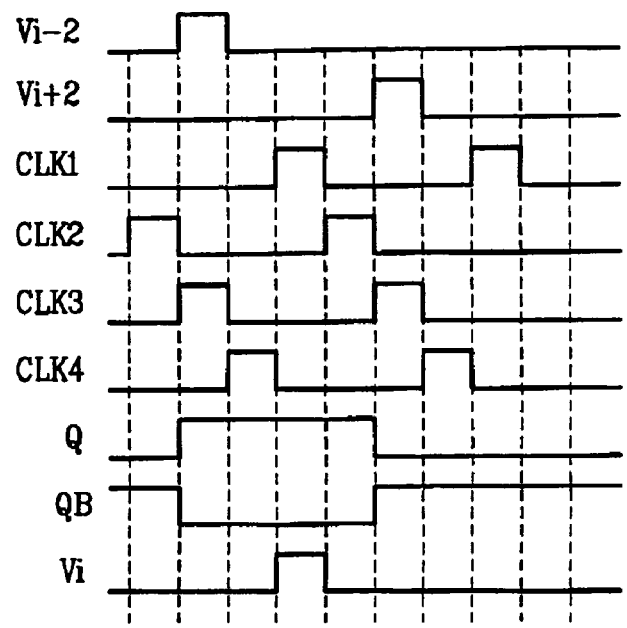
FIG. 5 illustrates exemplary driving waveforms for the shift register, a stage of which is shown in FIG. 4.

FIG. 5 illustrates exemplary driving waveforms for the shift register, a stage of which is shown in FIG. 4. Referring to FIG. 5, j1=1 and j2=2. Thus, the node controller 152 controls voltages at the first and second nodes Q and QB in response to the output signal Vi−2 from the (i−2)-numbered stage and the output signal Vi+2 from the (i+2)-numbered stage. To drive the shift register, four-phase clock signals CLK1, CLK2, CLK3, and CLK4 are sequentially phase-delayed by one clock period, and the first switching element T1 of each stage 151 is supplied with one of the delayed clock signals CLK1, CLK2, CLK3, and CLK4.

First, the node controller 152 of each stage 151 drives the first node Q to a high level using a high level output signal Vi−2 from the (i−2)-numbered stage and concurrently discharges the voltage at the second node QB to a low level using a low level output signal Vi+2 from the (i+2)-numbered stage. Thus, the first switching element T1 of the output unit 154 is turned on by the voltage on the first node Q to output to the output terminal Vo the high level clock signal CLK, which is supplied from one of four-phase clock signals CLK1, CLK2, CLK3, and CLK4.

Next, the node controller 152 of each stage 151 charges the second node QB at high level using a high level output signal Vi+2 from the (i+2)-numbered stage and concurrently discharges the voltage on the first node Q to low level using a low level output signal Vi−2 from the (i−2)-numbered stage. Thus, the second switching element T2 of the output unit 154 is turned on to output to the output terminal Vo a base voltage from a base power source VSS.

According to the first embodiment of the present invention, the node controller 152 in the shift register outputs the clock signal CLK to the output terminal Vo using the output signal Vi−j from the (i−j)-numbered stage and the output signal Vi+j from the (i+j)-numbered stage. Thus, odd numbered stages can be driven separately from even numbered stages. By separately driving the odd numbered stages and the even numbered stages, the shift register according to the first embodiment of the present invention reduces load of output lines to avoid error in operation. Moreover, according to the first embodiment of the present invention, the output signals from the shift register are divided into odd numbered output signals and even numbered output signals by controlling a timing of a start pulse SP.

Figure 6:
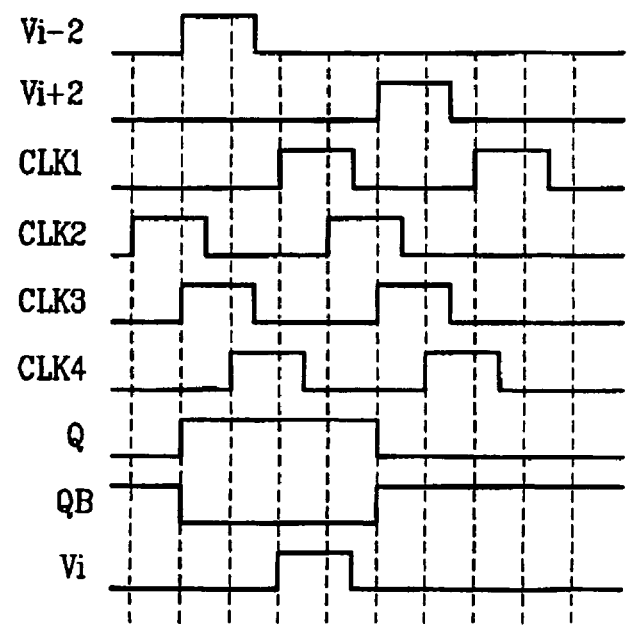
FIG. 6 illustrates alternate exemplary driving waveforms for the shift register, a stage of which is shown in FIG. 4.

FIG. 6 illustrates alternate exemplary driving waveforms for the shift register, a stage of which is shown in FIG. 4.

Referring to FIG. 6, j1=2 and j2=2. Thus, the node controller 152 controls voltages at the first and second nodes Q and QB in response to the output signal Vi−2 from the (i−2)-numbered stage and the output signal Vi+2 from the (i+2)-numbered stage. To drive the shift register, four-phase clock signals CLK1, CLK2, CLK3, and CLK4 are sequentially phase-delayed by one clock period, and the first switching element T1 of each stage 151 is supplied with one of the delayed clock signals CLK1, CLK2, CLK3, and CLK4. The four clock signals CLK1, CLK2, CLK3, and CLK4 overlap one another. A width of clock pulses for each of the clock signals CLK1, CLK2, CLK3 and CLK4 can be adjusted in accordance with different types of displays. For example, the width of the clock pulses can be changed in accordance with the resolution and/or the size of the display. Thus, while the shift register is driven in a similar manner as in the first embodiment described above with regard to FIGS. 4 and 5, the output signals Vo from respective stages overlap one another.

Figure 7:
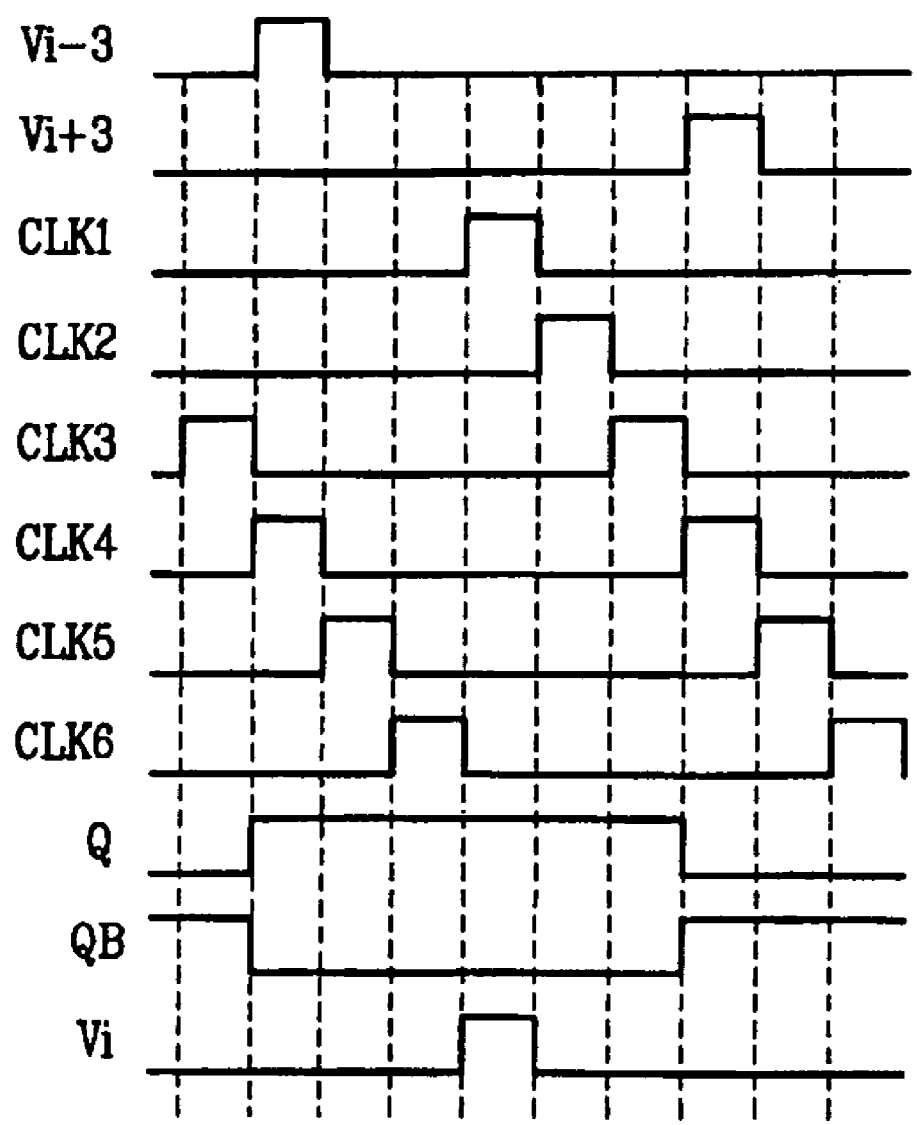
FIG. 7 illustrates further exemplary driving waveforms for the shift register, a stage of which is shown in FIG. 4.

FIG. 7 illustrates a further exemplary driving waveforms for the shift register, a stage of which is shown in FIG. 4. Referring to FIG. 7, j1=3 and j2=3 and the shift register is driven using six-phase clock signals CLK1 to CLK6. One of six clock signals CLK1 to CLK6 is supplied to each of six clock signal input lines in the shift register. Each stage 151 of the shift controller output an output signal Vo concurrently with the corresponding clock signal CLK in accordance with an output signal Vi−3 from the (i−3)-numbered stage and an output signal Vi+3 from the (i+3)-numbered stage. Alternatively, the six clock signals CLK1 to CLK6 can overlap one another so that the shift controller can output overlapped output signals Vo.

Figure 8:
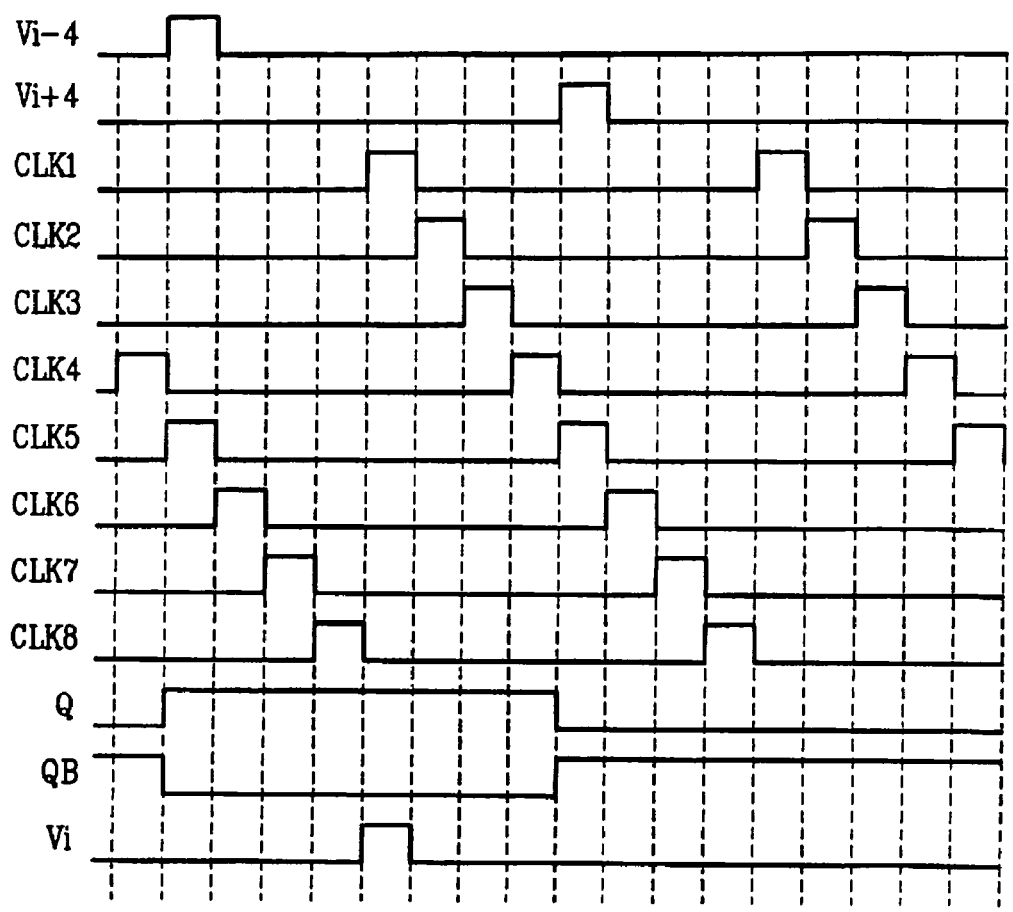
FIG. 8 illustrates more exemplary driving waveforms for the shift register, a stage of which is shown in FIG. 4.

FIG. 8 illustrates more exemplary driving waveforms for the shift register, a stage of which is shown in FIG. 4. Referring to FIG. 8, j1=4 and j2=4 and the shift register is driven using eight-phase clock signals CLK1 to CLK8. One of eight clock signals CLK1 to CLK8 is supplied to each of eight clock signal input lines in the shift register. Each stage 151 of the shift controller output an output signal Vo concurrently with the corresponding clock signal CLK in accordance with an output signal Vi−4 from the (i−4)-numbered stage and an output signal Vi+4 from the (i+4)-numbered stage. Alternatively, the eight clock signals CLK1 to CLK8 can overlap one another so that the shift controller can output overlapped output signals Vo.

Figure 9:
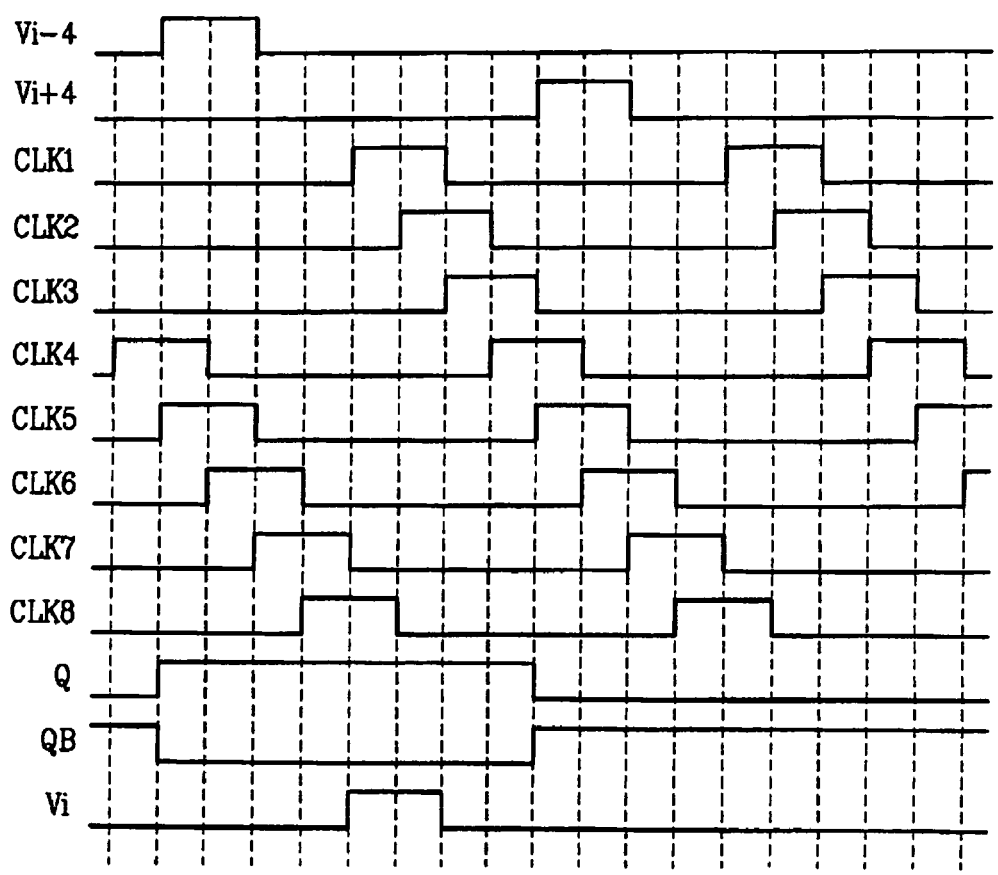
FIG. 9 illustrates still further more exemplary driving waveforms for the shift register, a stage of which is shown in FIG. 4.

FIG. 9 illustrates still further more exemplary driving waveforms for the shift register, a stage of which is shown in FIG. 4. Referring to FIG. 9, j1=4 and j2=4 and the shift register is driven using eight-phase clock signals CLK1 to CLK8. One of eight clock signals CLK1 to CLK8 is supplied to each of eight clock signal input lines in the shift register. Each stage 151 of the shift controller output an output signal Vo concurrently with the corresponding clock signal CLK in accordance with an output signal Vi−4 from the (i−4)-numbered stage and an output signal Vi+4 from the (i+4)-numbered stage. The eight clock signals CLK1 to CLK8 overlap one another. Accordingly, the shift controller outputs overlapped output signals Vo.

Figure 10:
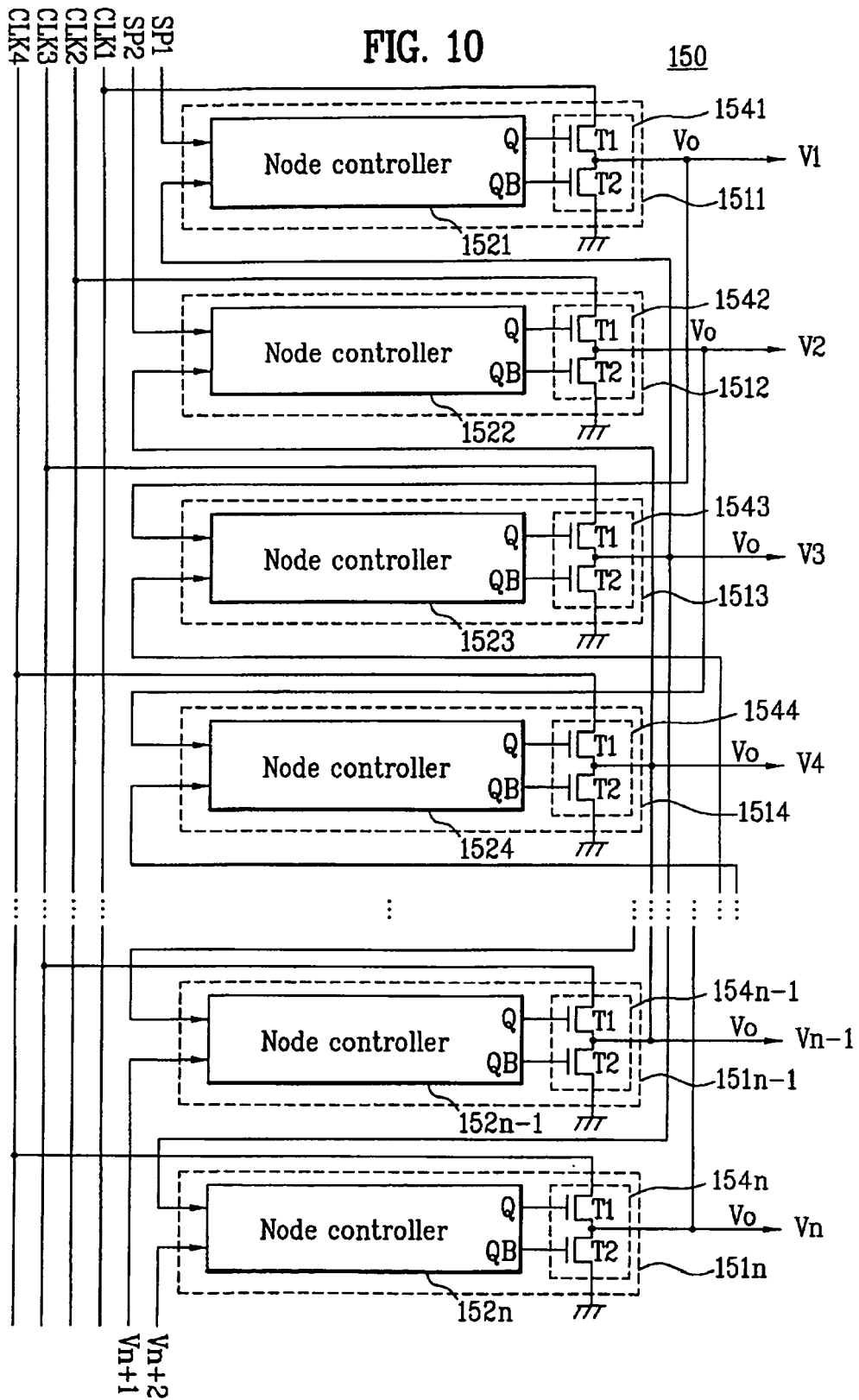
FIG. 10 illustrates a shift register according to the second embodiment of the present invention.

FIG. 10 illustrates a shift register according to the second embodiment of the present invention. Referring to FIG. 10, a shift register 150 includes first to n-th stages 1511 to 151n electrically connected to first to fourth clock signal input lines. Each of the first to n-th stages 1511 to 151n outputs one of four clock signals CLK1 to CLK4 supplied to the four clock signal input lines in accordance with the output signal Vi−2 from the (i−2)-numbered stage 151i−2 and the output signal Vi+2 from the (i+2)-numbered stage 151i+2. The first to fourth clock signals CLK1, CLK2, CLK3, and CLK4 are sequentially phase-delayed by one clock period.

The first stage 1511 is electrically connected to a first start pulse SP1 input line, the first clock signal CLK1 input line, and an output node Vo of the third stage 1513. The first start pulse SP1 precedes the first clock CLK1 by two clock periods.

The second stage 1512 is electrically connected to a second start pulse SP2 input line, the second clock signal CLK2 input line, and an output node Vo of the fourth stage 1514. The second start pulse SP2 lags the first start pulse SP1 by one clock period or is equal to the first start pulse SP1.

The first and second start pulses SP1 and SP2 can be output signals from a dummy stage electrically connected to a previous stage of the first stage 1511 or can externally be supplied. The (n+1)-numbered and (n+2)-numbered output signals Vn+1 and Vn+2 supplied to the (n−1)-th and n-th stages 151n−1 and 151n can be generated from two dummy stages electrically connected to the next stage of the n-th stage 151n or can externally be generated.

The third stage 1513 is electrically connected to the output node of the first stage 1511, the third clock signal CLK3 input line, and the output node Vo of the fifth stage 1515.

The fourth stage 1514 is electrically connected to the output node of the second stage 1512, the fourth clock signal CLK4 input line, and the output node Vo of the sixth stage 1516.

Likewise, each of the (4i+1)-numbered stages 1515, 1519 to 151n−3 excluding the first stage 1511, where i is a positive integer between 1 and n/4, is electrically connected to the first clock signal CLK1 input line, the output nodes of the (4i−1)-numbered stages 1513, 1517 to 151n+1, and the output nodes of the (4i+3)-numbered stages 1517, 1519 to 151n−1.

Furthermore, the (4i+2)-numbered stages 1516, 15110 to 151n−2 excluding the second stage 1512, where i is a positive integer between 1 and n/4, are connected to the second clock signal CLK2 input line, the output nodes of the 4i-numbered stages 1514, 1518 to 151n, and the output nodes of the (4i+2)-numbered stages 1518, 15110 to 151n.

Furthermore, the (4i+3)-numbered stages 1517, 15111 to 151n−1 excluding the third stage 1513 are electrically connected to the third clock signal CLK3 input line, the output nodes of the (4i+1)-numbered stages 1515, 1519 to 151n+1, and the output nodes of the (4i+5)-numbered stages 1519, 15113 to 151n+1, where i is a positive integer between 1 to n/4.

Furthermore, the 4i-numbered stages 1518, 15112 to 151n excluding the fourth stage 1514 are respectively connected to the fourth clock signal CLK4 input line, the output nodes of the (4i−2)-numbered stages 1516, 15110 to 151n−2, and the output nodes of the (4i+2)-numbered stages 15110, 15114 to 151n+2, where i is a positive integer between 1 and n/4.

The odd numbered stages and the even numbered stages of the aforementioned first to n-th stages 1511 to 151n are independently operated. In other words, the output signals of the odd numbered stages 1513, 1515 to 151n−1 excluding the first stage 1511 are supplied to previous odd numbered stages and next odd numbered stages. Also, the output signals of the even numbered stages 1514, 1516 to 151n excluding the second stage 1512 are supplied to previous even numbered stages and next even numbered stages.

The stages 1511 to 151n include respective node controllers 1521 to 152n and respective output units 1541 to 154n. Each 152i-numbered node controller 1521 to 152n controls voltages of first and second nodes Q and QB in response to an output signal Vi−2 from the (i−2)-numbered stage 151i−2 and an output signal Vi+2 from the (i+2)-numbered stage 151i−2.

The output lines 1541 to 154*n* output any one clock signal of the first to fourth clock signal input lines in response to the voltages of the first and second nodes Q and QB.

The node controllers 1521 to 152*n* control the voltage on the first node Q in response to the output signal Vi−2 from the (i−2)-numbered stage and concurrently control the voltage on the second node QB in response to the output signal Vi+2 from the (i+2)-numbered stage, as shown in Table 2.

TABLE 2

| Vi-2 | Vi + 2 | Q | QB |
|---|---|---|---|
| 1 | 0 | 1 | 0 |
| 0 | 1 | 0 | 1 |

Each of the output units 1541 to 154*n* outputs the clock signal CLK from the clock signal CLK input lines to the output terminal Vo in response to the voltages on the first and second nodes Q and QB controlled by the node controllers 1521 to 152*n*. To this end, each of the output units 1541 to 154*n* includes a first switching element T1 supplying the clock signal CLK to the output terminal Vo in response to the voltage on the first node Q, and a second switching element T2 supplying a base power source VSS to the output terminal Vo in response to the voltage on the second node QB.

According to the second embodiment of the present invention, the shift register outputs the clock signal CLK to the output terminal Vo using the output signal Vi−2 from the (i−2)-numbered stage and the output signal Vi+2 from the (i+2)-numbered stage.

Figure 11:
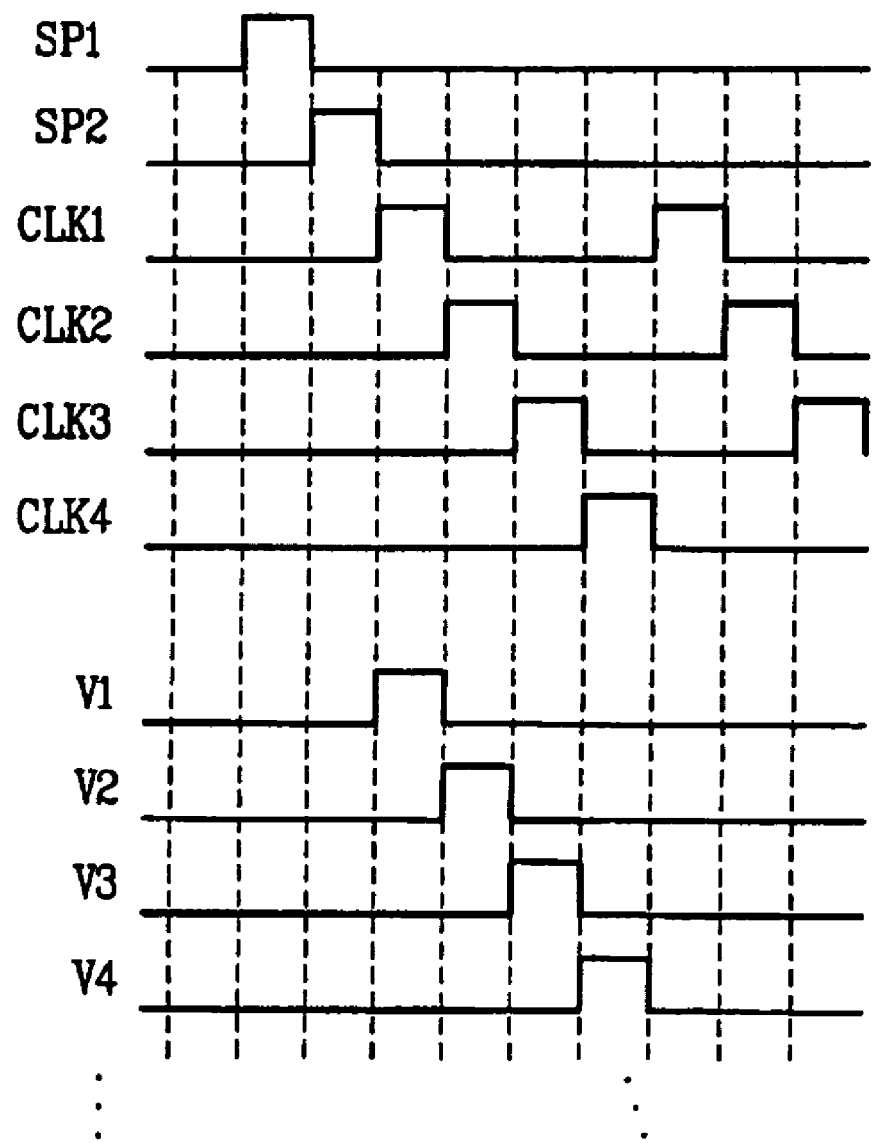
FIG. 11 illustrates exemplary driving waveforms for the shift register shown in FIG. 10.

FIG. 11 illustrates exemplary driving waveforms for the shift register shown in FIG. 10. Referring to FIG. 11, first, the first high level start pulse SP1 is supplied to the first stage 1511 along with the third low level output signal V3 from the third stage 1513. Thus, the node controller 1521 of the first stage 1511 charges a high level voltage in the first node Q in response to the first start pulse SP1. Accordingly, the second node QB becomes low level. Therefore, the output unit 1541 of the first stage 1511 outputs the first clock signal CLK1 of high level supplied from the first clock signal CLK1 input line to the output terminal Vo as the first output signal V1. Then, the first output signal V1 is supplied to the node controller 1523 of the third stage 1513.

Next, the second high level start pulse SP2 is supplied to the second stage 1512 along with the fourth output signal V4 of low level from the fourth stage 1514. Thus, the node controller 1522 of the second stage 1512 charges the high level voltage in the first node Q in response to the second start pulse SP2. At this time, the second node QB becomes low level. Therefore, the output unit 1542 of the second stage 1512 outputs the high level second clock signal CLK2 supplied from the second clock signal CLK2 input line to the output terminal Vo as the second output signal V2. Then, the second output signal V2 is supplied to the node controller 1524 of the fourth stage 1514.

The node controller 1523 of the third stage 1513 is supplied with the first output signal V1 of high level output from the first stage 1511 and the fifth output signal V5 of low level output from the fifth stage 1515 and charges the high level voltage in the first node Q in response to the first output signal V1. Then, the second node QB becomes low level. Therefore, the output unit 1543 of the third stage 1513 outputs the third clock signal CLK3 of high level supplied from the third clock signal CLK3 input line to the output terminal Vo as the third output signal V3. Then, the third output signal V3 is supplied to the node controllers 1521 and 1525 of the first and fifth stages 1511 and 1515. The node controller 1521 of the first stage 1511 supplies the base voltage on the second node QB using the third high level output signal V3 to discharge the output terminal Vo. Thus, the first output signal V1 remains low.

The node controller 1524 of the fourth stage 1514 is supplied with the second output signal V2 of high level output from the second stage 1512 and the sixth output signal V6 of low level output from the sixth stage 1516 and charges the high level voltage in the first node Q in response to the second output signal V2. Then, the second node QB becomes low level. Therefore, the output unit 1544 of the fourth stage 1514 outputs the fourth clock signal CLK4 of high level supplied from the fourth clock signal CLK4 input line to the output terminal Vo as the fourth output signal V4. Then, the fourth output signal V4 is supplied to the node controllers 1522 and 1526 of the second and sixth stages 1512 and 1516. The node controller 1522 of the second stage 1512 supplies the base voltage on the second node QB using the fourth output signal V4 of high level to discharge the output terminal Vo. Thus, the second output signal V1 remains low.

Meanwhile, the fifth to n-th stages 1515 to 151*n* are driven in a manner similar to the third and fourth stages 1513 and 1514 to output fifth to n-th output signals V5 to Vn.

Figure 12:
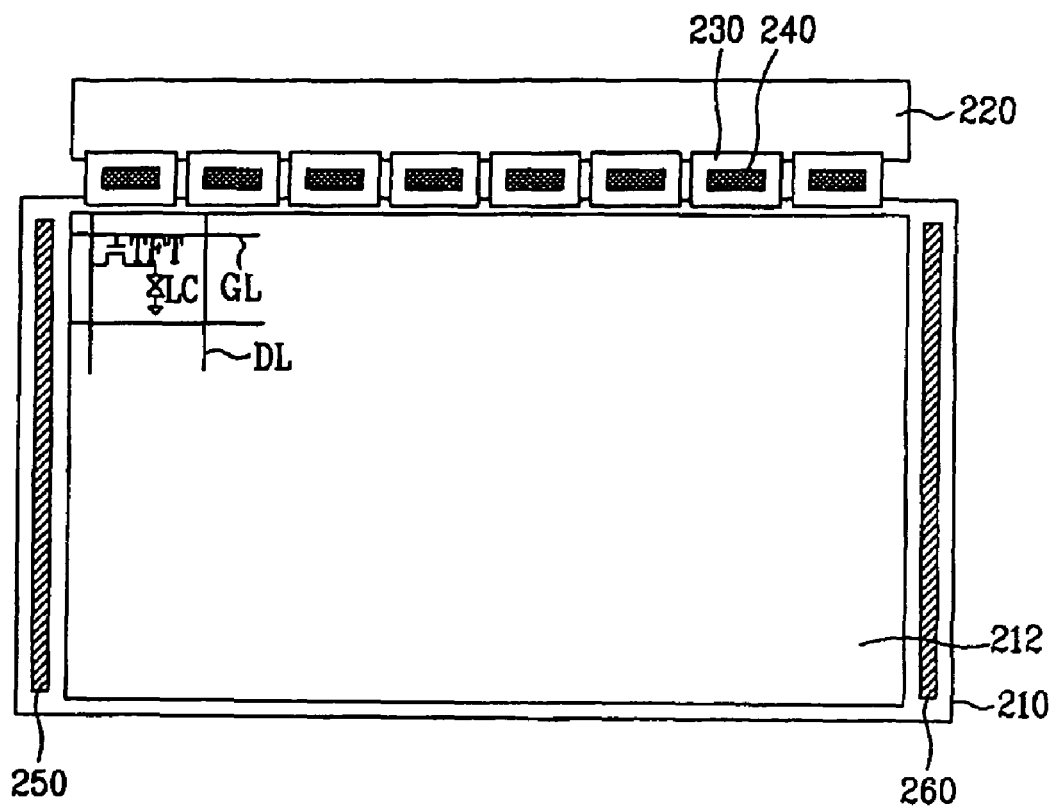
FIG. 12 shows an exemplary LCD according to another embodiment of the present invention.

FIG. 12 shows an exemplary LCD according to another embodiment of the present invention. Referring to FIG. 12, the exemplary LCD includes an image display unit 212 for displaying images, an LCD panel 210, a printed circuit board 220, a plurality of tape carrier packages (TCP) 230, and a plurality of data integrated circuits 240. The LCD panel 210 is provided with first and second gate shift registers 250 and 260 for supplying gate pulses to the image display unit 212. The printed circuit board 220 is provided with a control circuit (not shown) and a power circuit (not shown). The TCPs 230 are connected between the printed circuit board 220 and the LCD panel 210. The data integrated circuits 240 are respectively provided in the TCPs 230 and supply analog video signals to the image display unit 212.

The image display unit 212 displays images through liquid crystal cells (LC) arranged in a matrix. Each of the liquid crystal cells includes a TFT as a switching element electrically connected to a crossing of one of the gate lines GL with one of the data lines DL. For example, the TFT can include amorphous silicon. Alternatively, the TFT can include poly-crystalline silicon. Alternatively, other types of materials can be used for the TFT. The data lines DL are supplied with the analog video signals from the data integrated circuits 240. The gate lines GL are supplied with the gate pulses from the first and second gate shift registers 250 and 260.

Each of the TCPs 230 is electrically connected between the printed circuit board 220 and the LCD panel 210 by a tape automated bonding TAB. Input pads of each TCP 230 are electrically connected to the printed circuit board 220 while output pads of each TCP are electrically connected to the LCD panel 210.

Each of the data integrated circuits 240 is supplied with control signals and data signals from the control circuit through the input pads of each TCP 230 and converts the data signals into the analog video signals using the input control signals to supply the analog video signals to the data lines DL of the LCD panel 210 through the output pads of each TCP 230.

Figure 13:
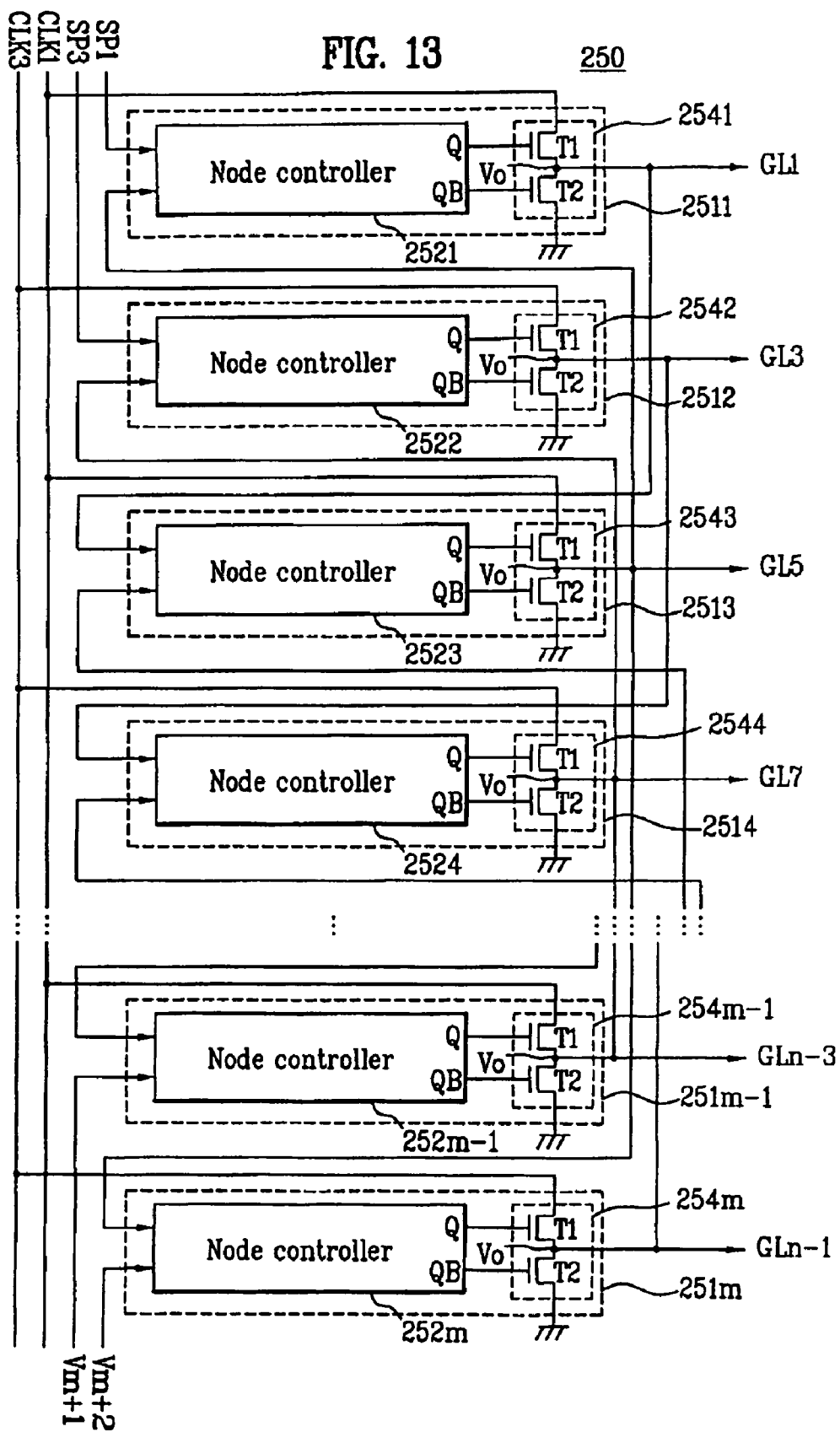
FIG. 13 illustrates an exemplary first gate shift register for the LCD shown in FIG. 12.

FIG. 13 illustrates an exemplary first gate shift register for the LCD shown in FIG. 12. As shown in FIG. 12, the first gate shift register 250 is formed at a first side of the LCD panel 210. Referring to FIG. 13, the first gate shift register 250 includes first to m-th stages 2511 to 251*m*, whose output nodes are respectively connected to each of odd numbered gate lines GL1, GL3, . . . GLn−1 of the gate lines GL, where m corresponds to half of the number of the gate lines GL1 to GLn. Each of the stages 2511 to 251m outputs one of the first and third clock signals CLK1 and CLK3 supplied to the first and third clock signal input lines using an output signal Vk−2 from the (k−2)-numbered stage 251k−2 (k is any one integer between 1 to m) and an output signal Vk+2 from the (k+2)-numbered stage 251k+2.

The first and third clock signals CLK1 and CLK3 are sequentially phase-delayed by one clock period. The first stage 2511 is electrically connected to the first start pulse SP1 input line, the first clock signal CLK1 input line, and an output node of the third stage 2513. The second stage 2512 is electrically connected to the third start pulse SP3 input line, the third clock signal CLK3 input line, and an output node of the fourth stage 2514. At this time, the third start pulse SP3 is slower than the first start pulse SP1 by two clocks or is equal to the first start pulse SP1.

Meanwhile, the first and third start pulses SP1 and SP3 can be output signals from a dummy stage electrically connected to a previous stage of the first stage 2511 or can externally be supplied. The (m+1)-th and (m+2)-th output signals Vm+1 and Vm+2 supplied to the (m−1)-th and m-th stages 251m−1 and 251m can be generated from two dummy stages connected to the next stage of the m-th stage 251m or can externally be generated.

The third stage 2513 is electrically connected to the output node of the first stage 2511, the first clock signal CLK1 input line, and the output node of the fifth stage 2515. The fourth stage 2514 is electrically connected to the output node of the second stage 2512, the third clock signal CLK3 input line, and the output node of the sixth stage 2516.

The aforementioned first gate shift register 250 is driven by dividing the first to m-th stages 2511 to 251m into odd numbered stages 2511, 2513, . . . 251m−1 and even numbered stages 2512, 2514, . . . 251m. The odd numbered stages 2513, 2515 to 251m−1 excluding the first stage 2511 are driven using output signals from previous odd numbered stages and next odd numbered stages. Also, the even numbered stages 2514, 2516 to 251m excluding the second stage 2512 are driven using previous even numbered stages and next even numbered stages.

Each of the stages 2511 to 251m includes node controllers 2521 to 252m and output units 2541 to 254m. The node controllers 2521 to 252m control the voltages of the first and second nodes Q and QB in response to an output signal Vk−2 from the k−2th stage 251k−2 and an output signal Vk+2 from the k+2th stage 251k+2. The output units 2541 to 254m output any one clock signal of the first and third clock signal input lines in response to the voltages of the first and second nodes Q and QB.

The node controllers 2521 to 252m control the voltage on the first node Q in response to the output signal Vk−2 from the k−2th stage and concurrently control the voltage on the second node QB in response to the output signal Vk+2 from the k+2th stage.

Each of the output units 2541 to 254m supplies one of the clock signals CLK1 and CLK3 from the first and third clock signal CLK1 and CLK3 input lines to the odd numbered gate lines GL1, GL3 . . . GLn−1 through the output terminal Vo in response to the voltages on the first and second nodes Q and QB controlled by the node controllers 2521 to 252m.

To this end, each of the output units 2541 to 254m includes a first switching element T1 supplying one of the clock signals CLK1 and CLK3 to the output terminal Vo in response to the voltage on the first node Q, and a second switching element T2 supplying a base power source VSS to the output terminal Vo in response to the voltage on the second node QB.

Figure 14:
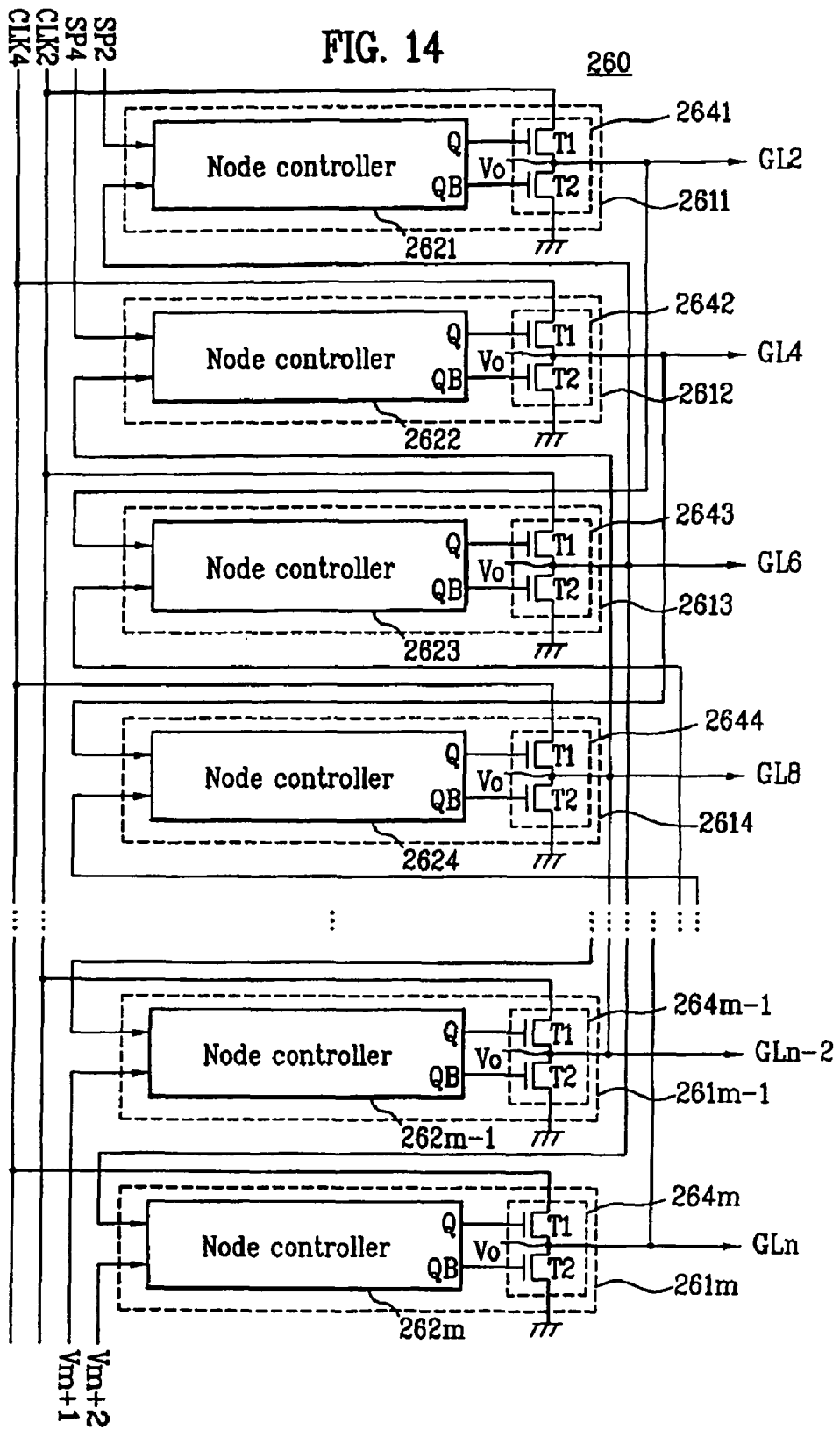
FIG. 14 illustrates an exemplary second gate shift register for the LCD shown in FIG. 12.

FIG. 14 illustrates an exemplary second gate shift register for the LCD shown in FIG. 12. As shown in FIG. 12, the second gate shift register 260 is formed at a second side of the LCD panel 210. Referring to FIG. 14, the second gate shift register 260 includes first to m-th stages 2611 to 261m whose output nodes are respectively connected to each of even numbered gate lines GL2, GL4, . . . GLn of the gate lines GL. Each of the stages 2611 to 261m outputs one of the second and fourth clock signals CLK2 and CLK4 supplied to the second and fourth clock signal input lines using an output signal Vk−2 from the k−2th stage 261k−2, where k is an integer between 1 to m, and an output signal Vk+2 from the k+2th stage 261k+2.

The second and fourth clock signals CLK2 and CLK4 are sequentially phase-delayed by one clock period. The first stage 2611 is electrically connected to the second start pulse SP2 input line, the second clock signal CLK2 input line, and an output node of the third stage 2613. The second stage 2612 is electrically connected to the fourth start pulse SP4 input line, the fourth clock signal CLK4 input line, and an output node of the fourth stage 2614. At this time, the fourth start pulse SP4 lags the second start pulse SP2 by two clock periods or is equal to the second start pulse SP2.

Meanwhile, the second and fourth start pulses SP2 and SP4 can be output signals from a dummy stage connected to a previous stage of the first stage 2611 or can be externally be supplied. The (m+1)-th and (m+2)-th output signals Vm+1 and Vm+2 supplied to the (m−1)-th and m-th stages 261m−1 and 251m may be generated from two dummy stages connected to the next stage of the m-th stage 261m or may externally be generated.

The third stage 2613 is electrically connected to the output node of the first stage 2611, the second clock signal CLK2 input line, and the output node of the fifth stage 2615. The fourth stage 2614 is electrically connected to the output node of the second stage 2612, the fourth clock signal CLK4 input line, and the output node of the sixth stage 2616.

The aforementioned second gate shift register 260 is driven by dividing the first to m-th stages 2611 to 261m into odd numbered stages 2611, 2613, . . . 261m−1 and even numbered stages 2612, 2614, . . . 261m. At this time, the odd numbered stages 2613, 2615 to 261m−1 excluding the first stage 2611 are driven using output signals from previous odd numbered stages and next odd numbered stages. Also, the even numbered stages 2614, 2616 to 261m excluding the second stage 2612 are driven using previous even numbered stages and next even numbered stages.

Each of the stages 2611 to 261m includes node controllers 2621 to 262m and output units 2641 to 264m. The node controllers 2621 to 262m control the voltages of the first and second nodes Q and QB in response to the output signal Vk−2 from the k−2th stage 251k−2 and the output signal Vk+2 from the k+2th stage 251k+2. The output units 2641 to 264m output one of the second and fourth clock signal input lines in response to the voltages of the first and second nodes Q and QB.

The node controllers 2621 to 262m control the voltage on the first node Q in response to the output signal Vk−2 from the k−2th stage and concurrently control the voltage on the second node QB in response to the output signal Vk+2 from the k+2th stage.

Each of the output units 2641 to 264m supplies one of the clock signals CLK2 and CLK4 from the second and fourth clock signal CLK2 and CLK4 input lines to the even numbered gate lines GL2, GL4 . . . GLn through the output terminal Vo in response to the voltages on the first and second nodes Q and QB controlled by the node controllers 2621 to 262m.

To this end, each of the output units 2641 to 264m includes a first switching element T1 supplying one of the clock signals CLK2 and CLK4 to the output terminal Vo in response to the voltage on the first node Q, and a second switching element T2 supplying a base power source VSS to the output terminal Vo in response to the voltage on the second node QB.

Figure 15:
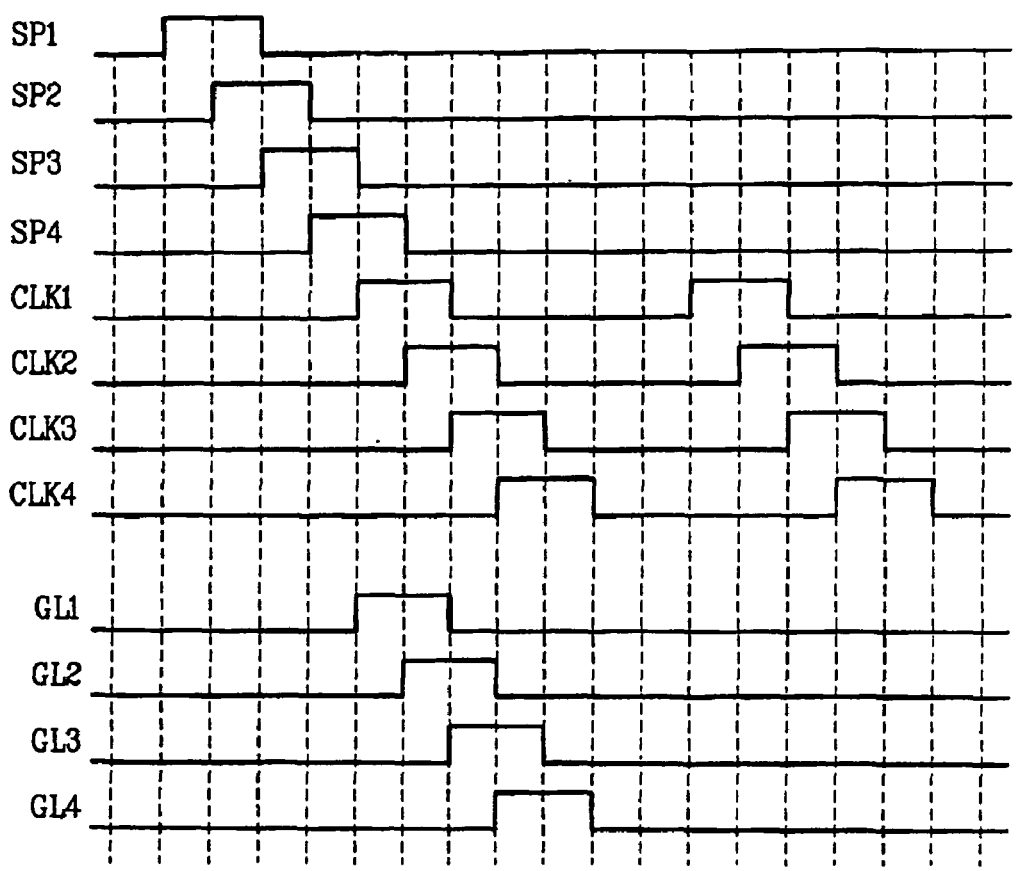
FIG. 15 illustrates exemplary driving waveforms for the first and second gate shift registers shown in FIGS. 13 and 14, respectively.

FIG. 15 illustrates exemplary driving waveforms for the first and second gate shift registers shown in FIGS. 13 and 14, respectively. Referring to FIG. 15, first, the first to fourth start pulses SP1 to SP4 are sequentially supplied to the first to fourth start pulse input lines such that they are phase-delayed to overlap by half their respective pulse phase. The first to fourth clock signals CLK1 to CLK4 are sequentially supplied to the first to fourth clock signal input lines such that they are phase-delayed and repeated to overlap by half their respective pulse phase.

Therefore, the first high level start pulse SP1 is supplied to the first stage 2511 of the first gate shift register 250 along with the low level gate pulses supplied to the fifth gate line GL5 from the third stage 2513. Thus, the node controller 2521 of the first stage 2511 charges the high level voltage in the first node Q in response to the first start pulse SP1. At this time, the second node QB becomes low level. Therefore, the output unit 2541 of the first stage 2511 of the first gate shift register 250 outputs the first clock signal CLK1 of high level supplied from the first clock signal CLK1 input line to the first gate line GL1 and the node controller 2523 of the third stage 2513.

Next, the second high level start pulse SP2 is supplied to the first stage 2611 of the second gate shift register 260 along with the low level gate pulses supplied to the sixth gate line GL6 from the third stage 2613. Thus, the node controller 2621 of the first stage 2611 charges the high level voltage in the first node Q in response to the second start pulse SP2. At this time, the second node QB becomes low level. Therefore, the output unit 2641 of the first stage 2611 of the second gate shift register 260 outputs the second high level clock signal CLK2 supplied from the second clock signal CLK2 input line to the second gate line GL2 and the node controller 2623 of the third stage 2613.

Subsequently, the third high level start pulse SP3 is supplied to the second stage 2512 of the first gate shift register 250 along with the low level gate pulses supplied to the seventh gate line GL7 from the fourth stage 2514. Thus, the node controller 2522 of the second stage 2512 charges the high level voltage in the first node Q in response to the third start pulse SP3. At this time, the second node QB becomes low level. Therefore, the output unit 2542 of the second stage 2512 of the first gate shift register 250 outputs the third high level clock signal CLK3 supplied from the third clock signal CLK3 input line to the third gate line GL3 and the node controller 2524 of the fourth stage 2514.

Next, the fourth high level start pulse SP4 is supplied to the second stage 2612 of the second gate shift register 260 along with the low level gate pulses supplied to the eighth gate line GL8 from the fourth stage 2614. Thus, the node controller 2622 of the second stage 2612 charges the high level voltage in the first node Q in response to the fourth start pulse SP4. At this time, the second node QB becomes low level. Therefore, the output unit 2642 of the second stage 2612 of the second gate shift register 260 outputs the fourth high level clock signal CLK4 supplied from the fourth clock signal CLK4 input line to the fourth gate line GL4 and the node controller 2624 of the fourth stage 2614.

Afterwards, the third to m-th stages 2513 to 251m of the first gate shift register 250 output one of the first and third clock signals CLK1 and CLK3 to the gate pulses using the output signal from the k−2th stage 251k−2 and the output signal from the k+2th stage 251k+2. As a result, the odd numbered gate lines GL5, GL7, . . . GLm−1 of the fifth to m-th gate lines GL5 to GLm are sequentially driven.

And, the third to m-th stages 2613 to 261m of the second gate shift register 260 output one of the second and fourth clock signals CLK2 and CLK4 to the gate pulses using the output signal from the k−2th stage 261k−2 and the output signal from the k+2th stage 261k+2. As a result, the even numbered gate lines GL6, GL8, . . . GLm of the sixth to m-th gate lines GL6 to GLm are sequentially driven.

According to an embodiment of the present invention, the first and second gate shift registers 250 and 260 are alternately driven so that the gate pulses can sequentially be supplied to the gate lines GL of the image display unit 212.

Meanwhile, according to an embodiment of the present invention, a scan direction of the gate lines GL of the image display unit 212 can be controlled by controlling the timing of the first to fourth start pulses SP1 to SP4. For example, if the timing of the first to fourth start pulses SP1 to SP4 is controlled to drive the second gate shift register 260 after the first gate shift register 250, the even numbered gate lines GL2, GL4, . . . GLm are driven after the odd numbered gate lines GL1, GL3, . . . GLm−1 are driven. As a result, the gate lines GL of the image display unit 212 are driven in the order of 1->3->5->7->9-> . . . ->m−1->2->4->6->8->10-> . . . ->m.

Also, if the timing of the first to fourth start pulses SP1 to SP4 is controlled to separately drive the odd numbered gate lines and the even numbered gate lines of each of the first and second gate shift registers 250 and 260, the gate lines GL of the image display unit 212 are driven in the order of 1->5-> 9-> . . . ->m−3->2->6->10-> . . . ->m−2->3->7->11-> . . . -> m−1->4->8->12-> . . . ->m.

In accordance with an embodiment of the present invention, the first and second shift gate registers 250 and 260 are formed at first and second sides of the LCD panel 210, and the odd numbered stages 2511 to 251m and the even numbered stages 2611 to 261m of the respective first and second gate shift registers 250 and 260 are separately driven. By separately driving the odd numbered stages 2511 to 251m and the even numbered stages 2611 to 261m, a load of the output lines of the shift registers is reduced to avoid error operation. Moreover, the scan direction of the gate lines GL of the image display unit 212 is controlled by controlling the timing of the first to fourth start pulses SP1 to SP4.

Figure 16:
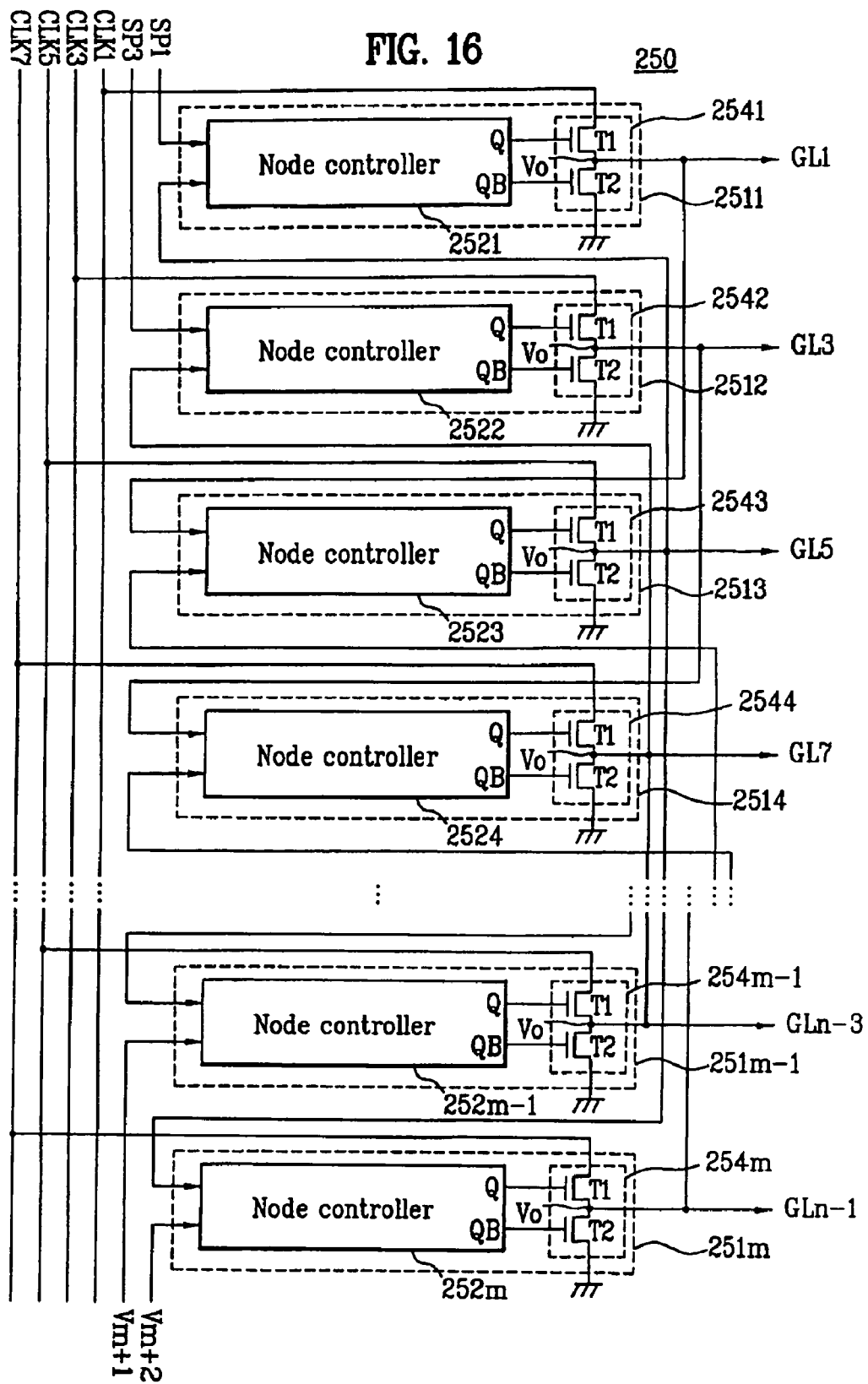
FIG. 16 illustrates another exemplary first gate shift register for the LCD shown in FIG. 12.
Figure 17:
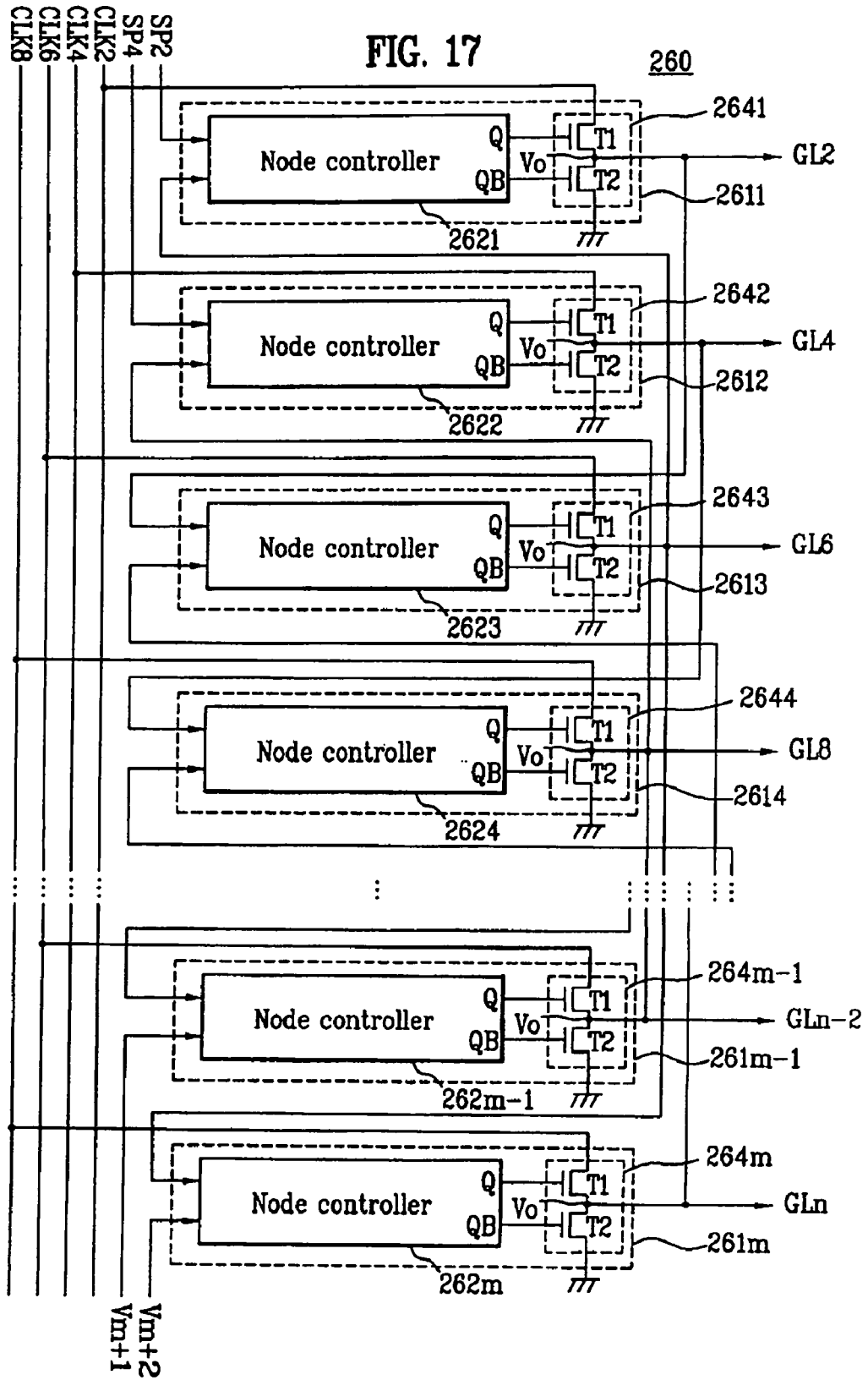
FIG. 17 illustrates another exemplary second gate shift register for the LCD shown in FIG. 12.
Figure 18:
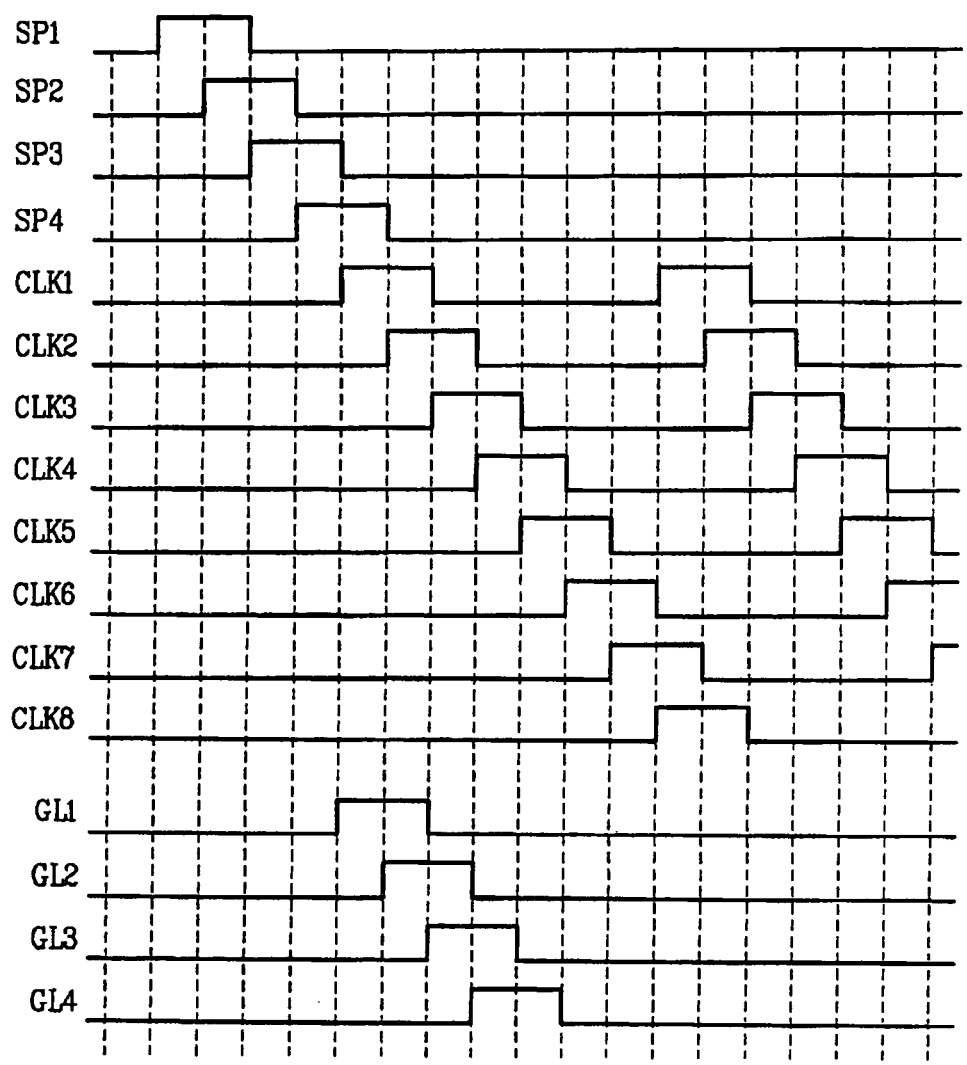
FIG. 18 shows exemplary driving waveforms for the first and second gate shift registers shown in FIGS. 16 and 17.

FIG. 16 illustrates another exemplary first gate shift register for the LCD shown in FIG. 12. FIG. 17 illustrates another exemplary second gate shift register for the LCD shown in FIG. 12. FIG. 18 shows exemplary driving waveforms for the first and second gate shift registers shown in FIGS. 16 and 17. The first gate shift register 250 is driven is a manner similar to the first gate shift register of FIG. 13, except for the use of four eight-phase clock signals CLK1, CLK3, CLK5 and CLK7 as shown in FIGS. 16 and 18. Therefore, a detailed description of the method of driving the first gate shift register will be omitted. Further, the second gate shift register 260 is driven in manner similar to the second gate shift register 260 shown in FIG. 14, except for the use of four eight-phase clock signals CLK2, CLK4, CLK6 and CLK8 as shown in FIGS. 17 and 18. Therefore, a detailed description of the method of driving the second gate shift register will be omitted.

Figure 19:
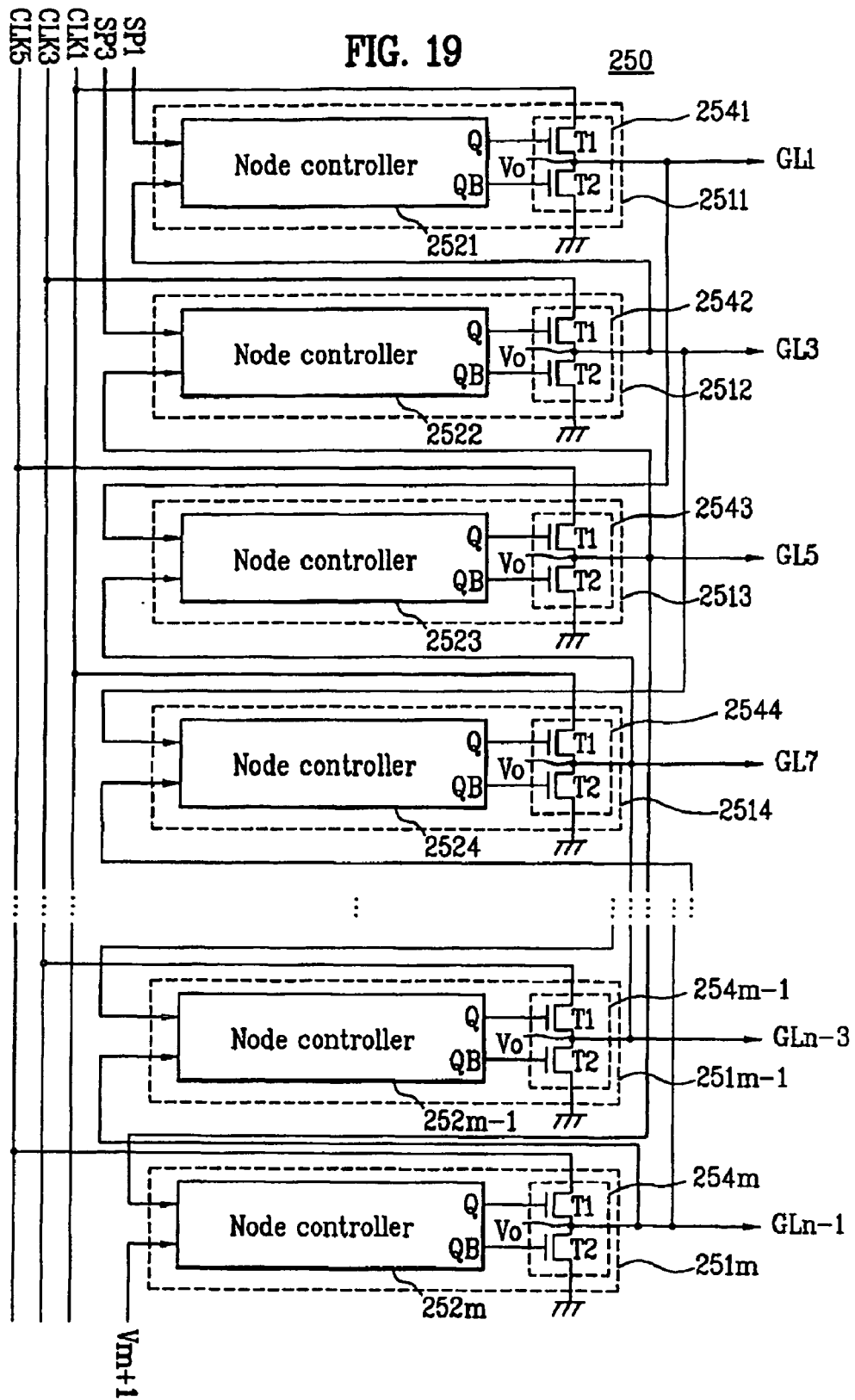
FIG. 19 illustrates yet another exemplary first gate shift register for the LCD shown in FIG. 12.
Figure 20:
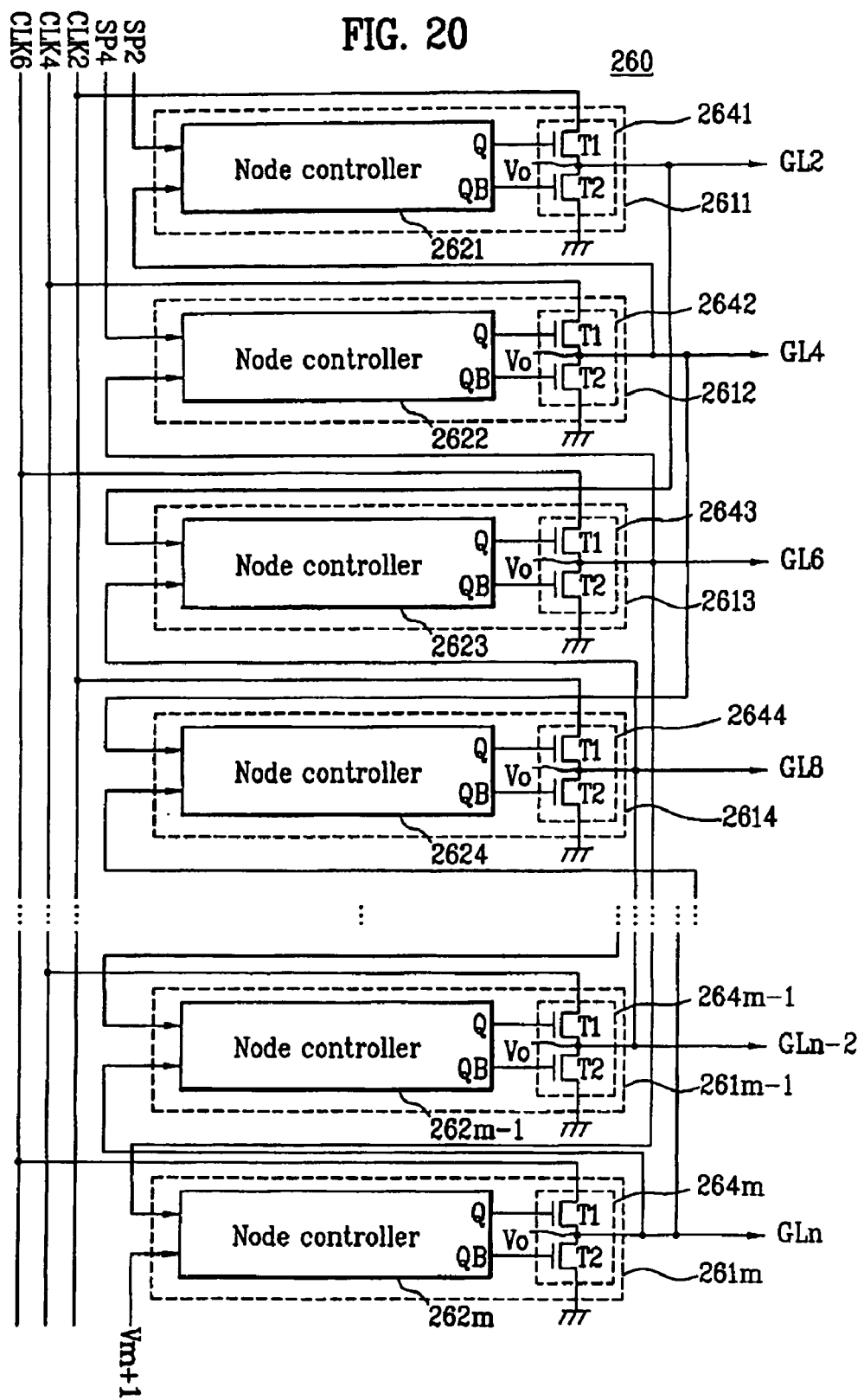
FIG. 20 illustrates yet another exemplary second gate shift register for the LCD shown in FIG. 12.
Figure 21:
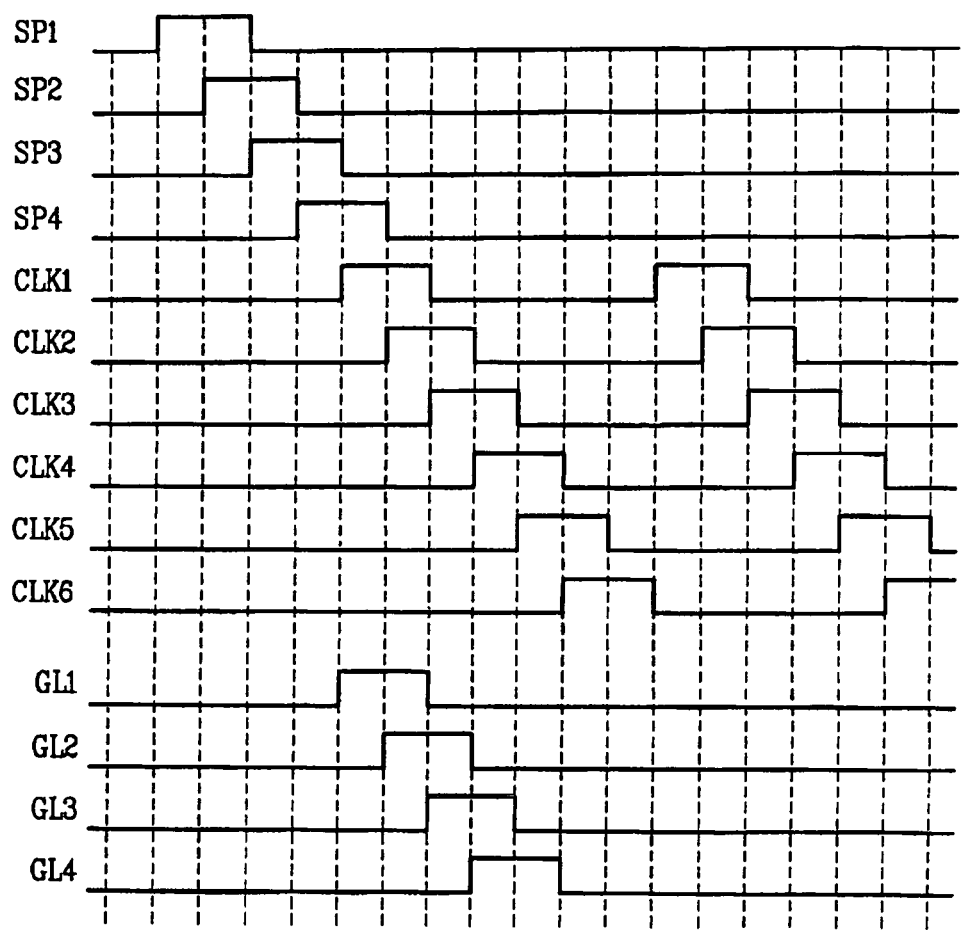
FIG. 21 shows exemplary driving waveforms for the first and second gate shift registers shown in FIGS. 19 and 20.

FIG. 19 illustrates yet another exemplary first gate shift register for the LCD shown in FIG. 12. FIG. 20 illustrates yet another exemplary second gate shift register for the LCD shown in FIG. 12. FIG. 21 shows exemplary driving waveforms for the first and second gate shift registers shown in FIGS. 19 and 20. Referring to FIGS. 19-21, the shift register selectively outputs the start pulse supplied to each stage by selecting one of six-phase clock signals CLK1 to CLK6 using the output signals supplied from the (k−j1)-th stage and the (k−j2)-th stage. In this case, j2 is a positive integer different from j 1. Hereinafter, j1 is equal to 2 and j2 is equal to 1.

Specifically, the first gate shift register 250 is initiated by the first and third start pulses SP1 and SP3, as shown in FIGS. 19 and 21. Also, the first gate shift register 250 supplies the gate pulses overlapped with the odd numbered gate lines of the image display unit as shown in FIG. 21 by selectively outputting one of three clock signals CLK1, CLK3, and CLK5 using the output signal from the (k−2)-th stage including the first and third start pulses SP1 and SP3 and the output signal from the (k+1)-th stage.

Furthermore, the second gate shift register 260 is initiated by the second and fourth start pulses SP2 and SP4, as shown in FIGS. 20 and 21. Also, the second gate shift register 260 supplies the gate pulses overlapped with the even numbered gate lines of the image display unit as shown in FIG. 21 by selectively outputting one of three clock signals CLK2, CLK4, and CLK6 using the output signal from the (k−2)-th stage including the second and fourth start pulses SP2 and SP4 and the output signal from the (k+1)-th stage.

Figure 22:
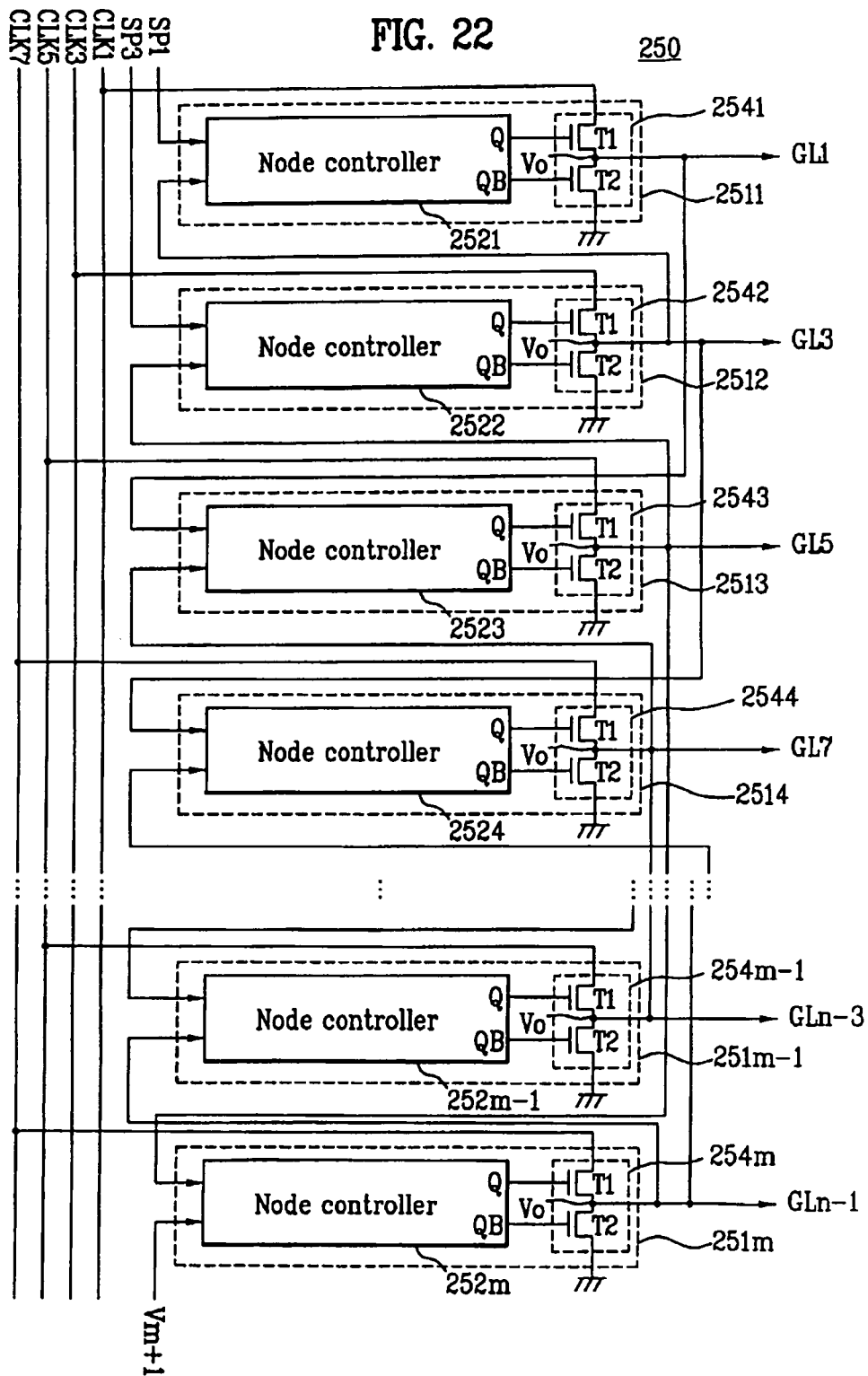
FIG. 22 illustrates still another exemplary first gate shift register for the LCD shown in FIG. 12.
Figure 23:
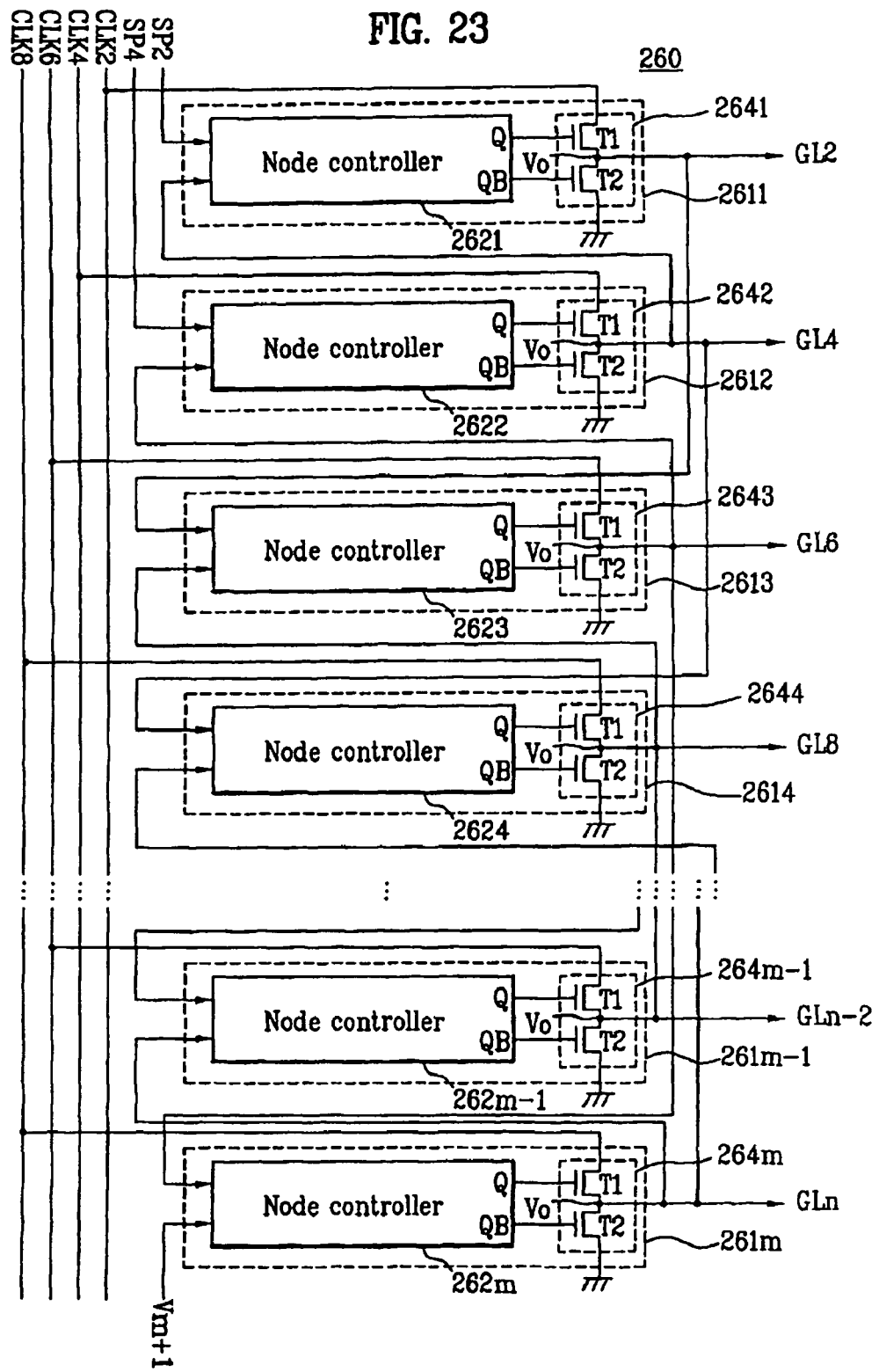
FIG. 23 illustrates still another exemplary second gate shift register for the LCD shown in FIG. 12.

FIG. 22 illustrates still another exemplary first gate shift register for the LCD shown in FIG. 12. FIG. 23 illustrates still another exemplary second gate shift register for the LCD shown in FIG. 12. Referring to FIGS. 22 and 23, the shift register selectively outputs the start pulse supplied to each stage by selecting one of eight-phase clock signals CLK1 to CLK8 using the output signals supplied from the (k−j1)-th stage and the (k−j2)-th stage. In this case, j2 is a positive integer different from j1. Hereinafter, j1 is equal to 2 and j2 is equal to 1.

Specifically, the first gate shift register 250 is initiated by the first and third start pulses SP1 and SP3, as shown in FIG. 22. Also, the first gate shift register 250 supplies the gate pulses overlapped with the odd numbered gate lines of the image display unit as shown in FIG. 18 by selectively outputting one of four clock signals CLK1, CLK3, CLK5 and CLK7 using the output signal from the k−2th stage including the first and third start pulses SP1 and SP3 and the output signal from the (k+1)-th stage.

Furthermore, the second gate shift register 260 is initiated by the second and fourth start pulses SP2 and SP4, as shown in FIG. 23. Also, the second gate shift register 260 supplies the gate pulses overlapped with the even numbered gate lines of the image display unit as shown in FIG. 18 by selectively outputting one of four clock signals CLK2, CLK4, CLK6, and CLK8 using the output signal from the (k−2)-th stage including the second and fourth start pulses SP2 and SP4 and the output signal from the (k+1)-th stage.

According to embodiments of the present invention, the shift register can be used for a display device that displays images through pixel cells each which include a switching element at each crossing of a gate line with a data line.

As described above, According to embodiments of the present invention, the odd numbered stages and the even numbered stages of the shift register are separately driven using the output signal from the (i−j)-numbered stage and the output signal from the (i+j)-numbered stage. Therefore, by separately driving the odd numbered stages and the even numbered stages, a load of the output lines of the shift register can be reduced to avoid error operation. Also, the scan direction of the gate lines can be controlled by controlling the timing of the start pulses supplied to the shift register.

Additionally, in the display device using the shift register and the driving method thereof according to embodiments of the present invention, the gate shift registers are formed at both sides of the LCD panel, and the respective shift registers are driven using the output signal from the (i−j)-numbered stage and the output signal from the (i+j)-numbered stage so that their odd numbered stages and even numbered stages can separately be driven. Therefore, by separately driving the odd numbered stages and the even numbered stages, a load of the output lines of the shift registers can be reduced to avoid any error operation. Also, since the timing of the start pulses supplied to the shift registers is controlled, it is possible to control the scan direction of the gate lines.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A shift register including a plurality of first to n-numbered stages, where n is a positive integer, i-number stage comprising:
    a node controller for controlling a voltage of a first node in accordance with an output signal from the (i−j)-numbered stage and a voltage of a second node in accordance with an output signal from the (i+j)-numbered stage, wherein i is a positive integer greater than or equal to 3, j is 2, 3, or 4; and
    an output unit for outputting one of a plurality of clock signals in accordance with the respective voltages of the first and second nodes,
    wherein the plurality of clock signals includes a number six of clock signals if j is 3 or a number eight of clock signals if j is 4.

2. The shift register of claim 1, wherein the output unit includes a first switching element supplying the one of the plurality of clock signals in accordance with the voltage of the first node, and a second switching element discharging a voltage of the output unit in accordance with the voltage of the second node.

3. The shift register of claim 1, wherein the clock signals are sequentially phase-delayed.

4. The shift register of claim 1, wherein the clock signals are sequentially phase-delayed for one of the clock signal to overlap the next clock signal.

5. A method of driving a shift register including a plurality of first to n-numbered stages, where n is a positive integer, comprising:
    controlling a voltage of a first node in accordance with an output signal from the (i−j)-numbered stage and a voltage of a second node in accordance with an output signal from the (i+j)-numbered stage in each stage, wherein i is a positive integer greater than or equal to 3, j is 2, 3, or 4; and
    outputting one of a plurality of 2j-number of clock signals in accordance with the respective voltages of the first and second nodes,
    wherein the plurality of clock signals includes a number six of clock signals if j is 3 or a number eight of clock signals if j is 4.

6. The method of claim 5, including sequentially phase-delaying the clock signals.

7. The method of claim 5, including sequentially phase-delaying the clock signals to overlap one another.

* * * * *